United States Patent [19]
Hara et al.

[11] Patent Number: 5,854,819
[45] Date of Patent: Dec. 29, 1998

[54] MASK SUPPORTING DEVICE AND CORRECTION METHOD THEREFOR, AND EXPOSURE APPARATUS AND DEVICE PRODUCING METHOD UTILIZING THE SAME

[75] Inventors: Shinichi Hara, Kita Kawabemachi; Takeshi Miyachi, Utsunomiya; Nobutoshi Mizusawa, Yamato; Yuji Chiba; Kazuyuki Kasumi, both of Utsunomiya, all of Japan

[73] Assignee: Canon Kabushiki Kaisha, Tokyo, Japan

[21] Appl. No.: 797,467

[22] Filed: Feb. 6, 1997

[30] Foreign Application Priority Data

| Feb. 7, 1996 | [JP] | Japan | 8-045495 |
| Sep. 25, 1996 | [JP] | Japan | 8-252953 |
| Sep. 25, 1996 | [JP] | Japan | 8-253215 |

[51] Int. Cl.⁶ .................................................. H01L 21/30
[52] U.S. Cl. ............................................. 378/34; 378/208
[58] Field of Search .............................. 378/34, 35, 208; 250/492.1

[56] References Cited

U.S. PATENT DOCUMENTS

| 3,569,718 | 3/1971 | Borner ..................................... 250/201 |
| 4,385,434 | 5/1983 | Zehnpfennig et al. ............... 378/34 X |
| 4,592,081 | 5/1986 | Eaton et al. . |
| 4,969,168 | 11/1990 | Sakamoto et al. . |
| 4,999,506 | 3/1991 | Mizusawa et al. . |
| 5,026,239 | 6/1991 | Chiba et al. . |
| 5,063,582 | 11/1991 | Mori et al. . |
| 5,093,579 | 3/1992 | Amemiya et al. . |
| 5,155,523 | 10/1992 | Hara et al. . |
| 5,160,961 | 11/1992 | Marumo et al. . |
| 5,184,176 | 2/1993 | Unno et al. ............................... 355/52 |
| 5,191,218 | 3/1993 | Mori et al. . |
| 5,220,171 | 6/1993 | Hara et al. . |
| 5,253,012 | 10/1993 | Chiba et al. . |
| 5,323,440 | 6/1994 | Hara et al. . |
| 5,333,167 | 7/1994 | Iizuka et al. ............................... 378/35 |
| 5,356,686 | 10/1994 | Fujioka et al. . |
| 5,413,167 | 5/1995 | Hara et al. . |
| 5,485,495 | 1/1996 | Miyachi et al. . |
| 5,504,793 | 4/1996 | Chen ..................................... 378/35 X |
| 5,544,213 | 8/1996 | Chiba et al. . |
| 5,593,800 | 1/1997 | Fujioka et al. . |
| 5,608,773 | 3/1997 | Kortenaga et al. . |

*Primary Examiner*—David P. Porta
*Attorney, Agent, or Firm*—Fitzpatrick, Cella, Harper & Scinto

[57] ABSTRACT

There is disclosed a mask supporting device comprising a chuck mechanism for supporting a mask substrate provided with a rectangular window in which a mask pattern is formed, and a frame for reinforcing the mask substrate, and a mechanism for applying, to said frame of the mask, loads from mutually orthogonal directions. The mechanism for applying loads includes a fixed reference contacting two positions on the external periphery of the mask frame and two pressing mechanism for applying loads to the mask frame from two directions respectively opposed to the two contact positions.

14 Claims, 20 Drawing Sheets

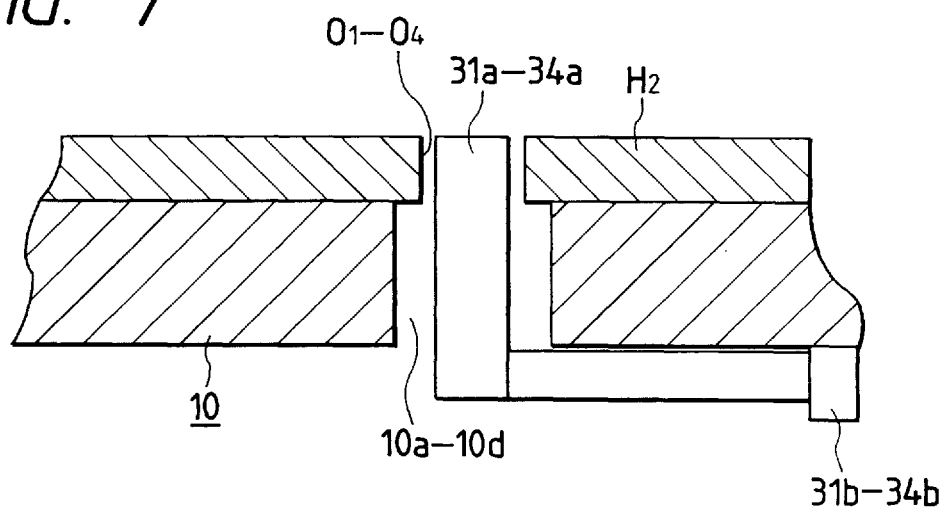
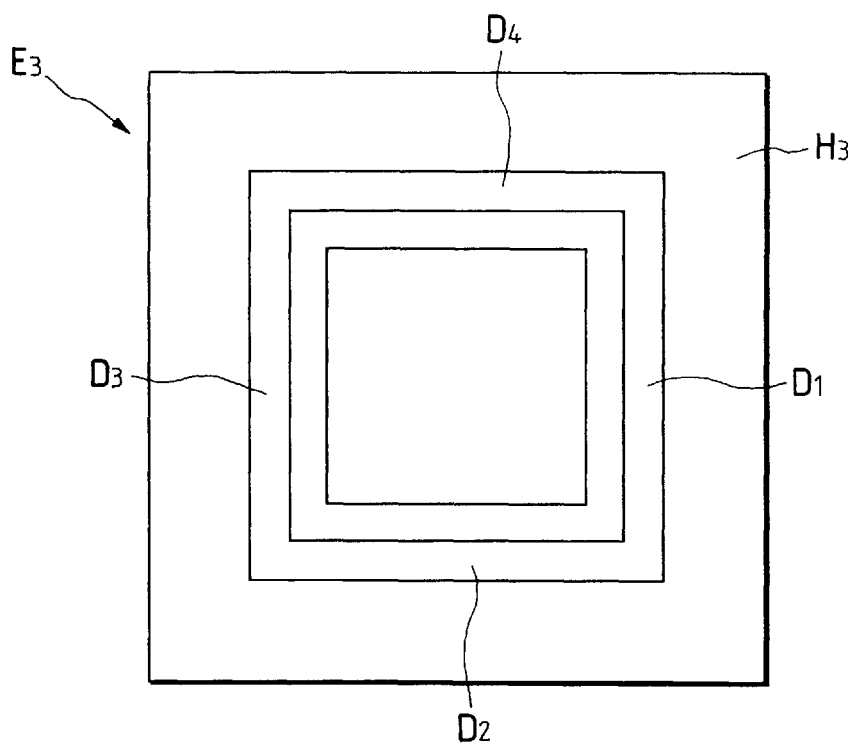

MASK SUPPORTING DEVICE AND CORRECTION METHOD THEREFOR, AND EXPOSURE APPARATUS AND DEVICE PRODUCING METHOD UTILIZING THE SAME

BACKGROUND OF THE INVENTION

1. Field of the Invention

The present invention relates to a technology for correcting the shape (size or distortion) of the pattern of a mask, adapted for use in a semiconductor exposure apparatus utilizing a radiation such as X-ray.

2. Related Background Art

Circuit patterns of semiconductor devices, such as LSI, have become progressively finer in recent years, to increase the level of integration and improve the function speed of such devices. In circuit pattern formation in the preparation of such LSI, fine pattern formation by lithography utilizing high-intensity X-ray, for example, from a synchrotron ring (SR), etc. is attracting attention. One of the most effective methods for exposure with X-ray consists of equal-size exposure transfer by X-ray irradiation onto a mask and a wafer positioned in proximity.

In such a method, in which the transfer of the pattern is executed in equal size by positioning the mask and the wafer at a very small, mutual distance therebetween of several microns, it is difficult to adjust the transfer magnification of the mask pattern onto the wafer, but U.S. Pat. No. 4,592,081 discloses a method for realizing such adjustment by clamping the periphery of a frame, supporting a thin film wherein the mask pattern is formed, with three clamping means, and causing a relative movement of these clamping means to actively deform the frame, thereby indirectly adjusting the pattern magnification on the mask membrane.

SUMMARY OF THE INVENTION

However in such a conventional method, utilizing clamping at three points and variations in the relative distances among these clamping points, it is difficult to obtain isotropic deformation of the mask in the mutually orthogonal X, Y directions. Therefore, a precise adjustment of the transfer magnification is difficult and such method cannot be considered practical.

The object of the present invention is to improve the above-mentioned conventional technology, and to provide a device and a method capable of precisely correcting the shape (size corresponding to transfer magnification, and distortion, etc.) of the mask pattern by a simple configuration.

The above-mentioned object can be attained, according to a preferred embodiment of the present invention, by a mask supporting device comprising a chucking mechanism supporting a mask including a mask substrate provided with a rectangular window in which a mask pattern is formed and a rectangular or circular frame for reinforcing the mask substrate, and a mechanism for applying loads in mutually orthogonal X and Y directions to the frame of the mask supported by the chucking mechanism.

The above-mentioned mechanism for load application includes, for example, a fixed reference member contacting the external periphery of the mask frame, for example, in two positions, and two pressing mechanisms for applying loads to the mask frame, from the directions respectively opposed to the two contact positions.

Other objects of the present invention, and the advantages thereof, will become fully apparent from the following description of the embodiments.

BRIEF DESCRIPTION OF THE DRAWINGS

FIG. 7 is a partial schematic cross-sectional view of a part of the device shown in FIG. 5;

FIG. 8 is a plan view, seen from the rear side, of a mask in a variation of the third embodiment;

DETAILED DESCRIPTION OF THE PREFERRED EMBODIMENTS

Figure 1:
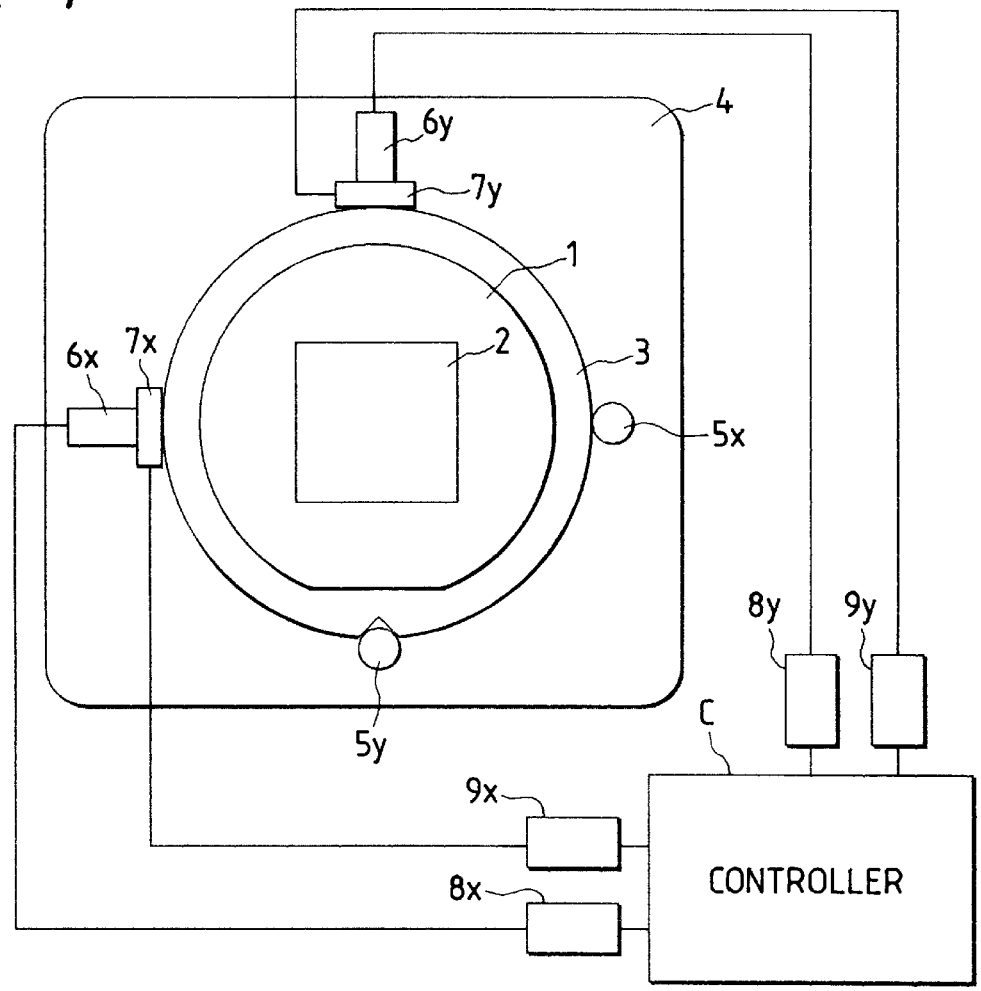
FIG. 1 is a schematic view of a magnification correcting mechanism of an embodiment of the present invention.

Now the present invention will be clarified in detail by preferred embodiments thereof. FIG. 1 is a schematic view of a magnification correcting mechanism by deformation in plane of an X-ray mask, to be employed in a mask chucking device of an X-ray exposure apparatus.

A mask substrate 1 for the X-ray mask is composed of a silicon wafer. The X-ray mask is formed by forming a SiN or SiC film on the surface of the mask substrate 1, then etching the mask substrate 1 from the rear face thereof to obtain a mask membrane 2 consisting of the SiN or SiC film, and patterning thereon an X-ray absorbing material, for example a metal such as W or Ta, to obtain a transfer pattern. The transfer pattern of the X-ray mask is prepared, in this patterning step, slightly larger than the ideal size of the pattern, and the offset in magnification of the transfer pattern is determined from a process distortion anticipated in the wafer process after the pattern transfer. A frame 3 for reinforcing the mask substrate is provided with a positioning notch in a position on the external periphery. The X-ray mask member, after positioning by a positioning pin 5y, is preferably supported by a mechanical chuck having plural mechanical clampers, but there may also be employed a vacuum chuck, a magnetic chuck or an electrostatic chuck.

There are provided PZT actuators 6x, 6y and PZT actuator drivers 8x, 8y, but there may also be employed other actuators capable of generating driving force such as motors or linear-moving cylinders. There are also provided load cells for detecting the load, composed of strain gauges 7x, 7y and amplifiers 9x, 9y therefor. The set of the above-mentioned components is provided for each of the mutually orthogonal two directions X, Y along the plane of the mask pattern of the X-ray mask member, so that the application and measurement of the load can be executed independently in each direction. There is also provided a controller C.

Figure 2:
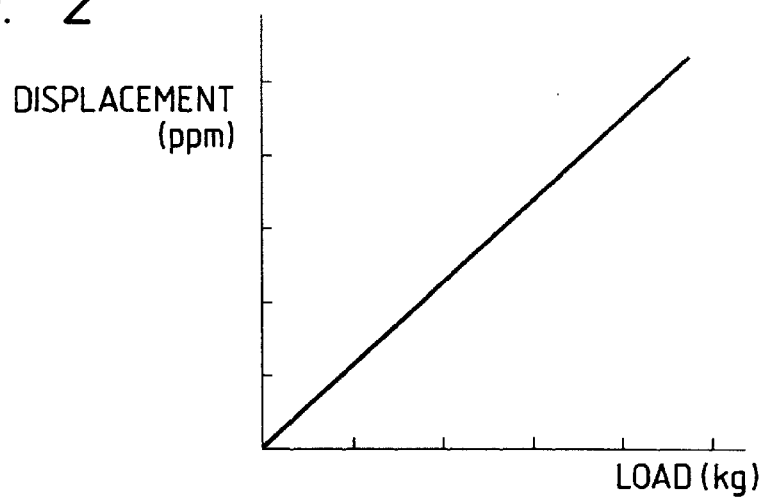
FIG. 2 is a chart showing the amount of displacement in the pattern magnification as a function of load.

The relationship between the amount of displacement of the mask pattern and the load applied to the X-ray mask member is determined statistically in advance, based on measurements in the exposure apparatus or another measuring apparatus (length measuring apparatus) different from the exposure apparatus. When there is determined a relationship between the amount of displacement of the mask pattern and the load applied to the mask, for example as shown in FIG. 2, such relationship is loaded in the controller C in the form of a data table or a converting equation.

The above-explained device functions in the following manner. At first, prior to the exposure operation, the magnification of the mask and the wafer pattern is measured by an alignment measuring system provided in the exposure apparatus, and there is determined a set load to be applied to the mask for achieving necessary correction of the magnification, utilizing the above-mentioned relationship, stored in the controller C, between the amount of displacement of the mask pattern and the set load applied to the mask. Then a voltage is applied to the PZT actuator in such a manner that the load detected by the load cell becomes equal to the set load. By servo control of the PZT actuator based on the output of the load cell, a constant load can be always applied to the mask member even in the presence of a minute displacement of the mask, etc. Further, by conducting such servo control also in the course of the exposure operation, there can be achieved correction also for the variation in the pattern magnification, resulting from thermal distortion induced by the exposing light.

In the following there will be explained another embodiment with reference to the attached drawings.

Figure 3A:
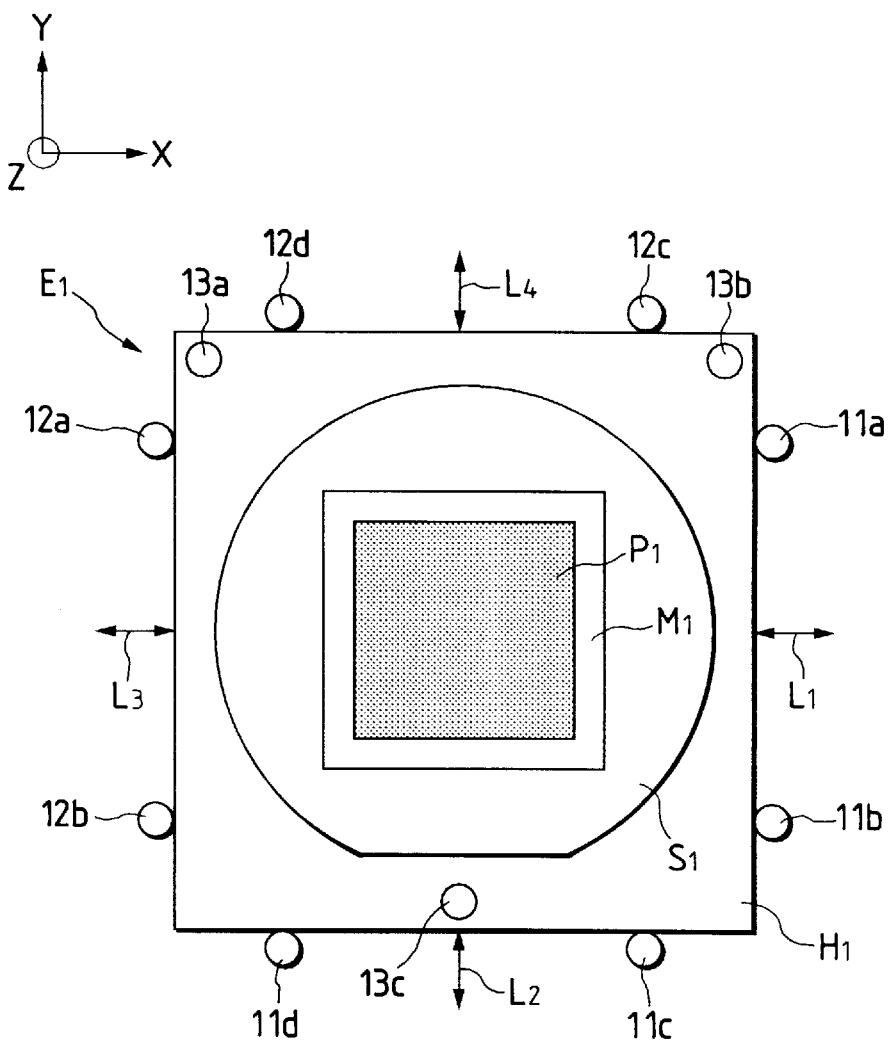
FIGS. 3A and 3B are, respectively, a plan view and a cross-sectional view of a mask in a second embodiment.
Figure 3B:
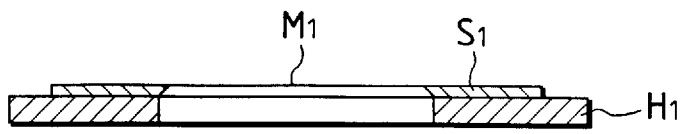

FIGS. 3A and 3B show a mask E1 which is an original of a second embodiment, including, as in the conventional art, a mask substrate S1 composed, for example, of a Si substrate, a membrane M1 provided in a central aperture of the substrate, and a mask frame H1 composed of a rectangular frame member adhered to the mask substrate S1, and the membrane M1 bears thereon a pattern P1 composed of an X-ray absorbing heavy metal such as Au.

The mask frame H1 is composed of a material of low thermal expansion, for example a glass or a ceramic material such as SiC or SiN, or a Si substrate. The mask substrate S1 is connected to the mask frame H1 by adhesion or anodic adhesion. The membrane M1 is an X-ray transmitting thin film such as SiN, which is formed for example by CVD method on a flat mask substrate S1 of which central portion is then eliminated by back etching to form the above-mentioned aperture. The pattern P1 is obtained by forming a thin film of Au or the like on the membrane M1 after the mask substrate S1 having the aperture is combined to the mask frame H1 and patterning such thin film, for example, by an electron beam (EB) drawing apparatus.

Figure 4:
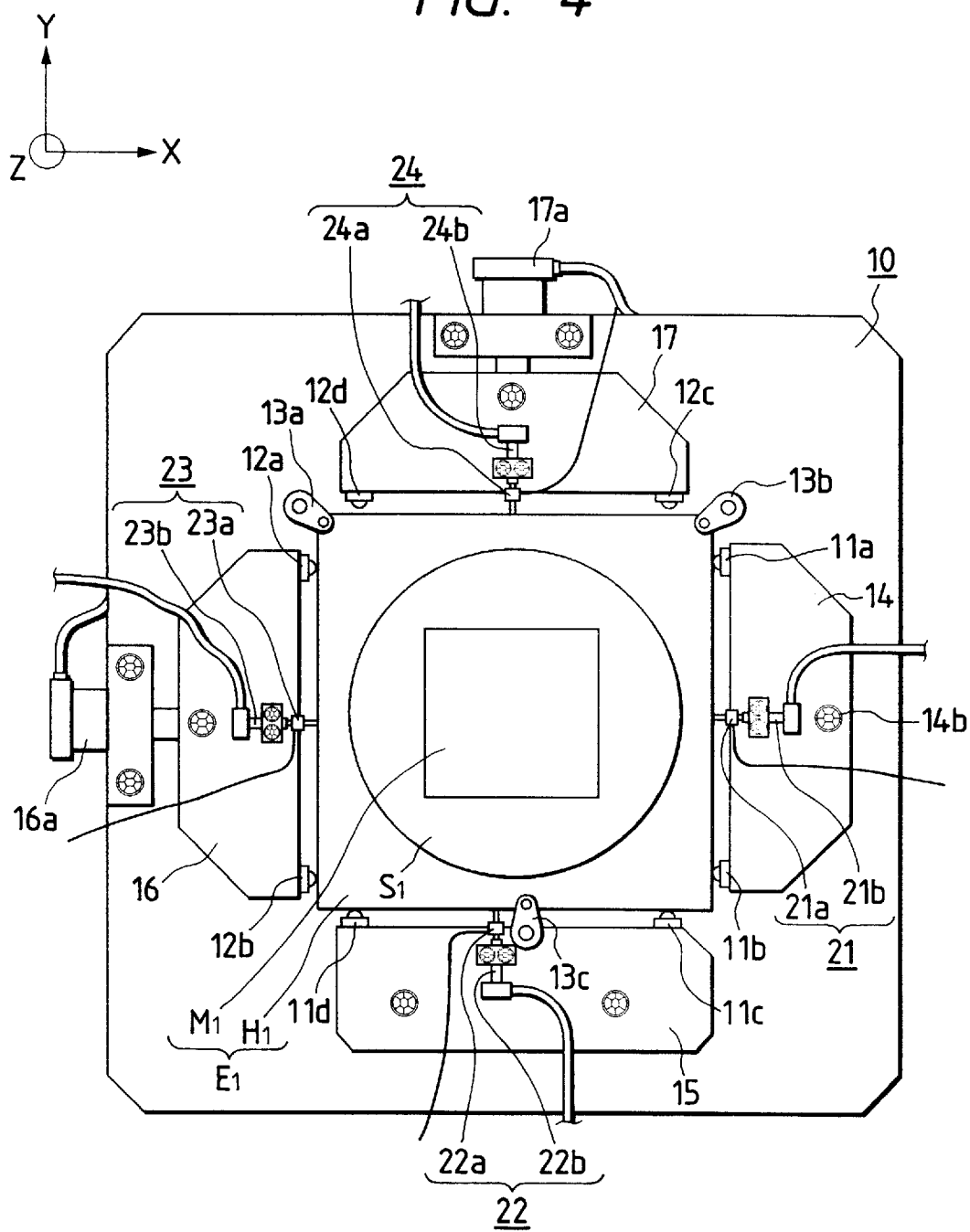
FIG. 4 is a schematic plan view of a mask supporting device of the second embodiment.

A mask supporting device 4, constituting an original supporting device for supporting the mask E1 in an EB drawing apparatus or in an X-ray exposure apparatus, fixes (positions) the mask E1 by a three-point clamping method. As shown in FIG. 4, the positioning of the mask E1 in directions of X, Y and ω Z axes is achieved by maintaining the two orthogonal lateral edges of the mask E1 in contact with an XY positioning device consisting of positioning members 11a–11d in the X and Y directions, integral with the mask chuck 10, and by pressing the mask E1 toward the XY positioning device by a pressing device consisting of pressing members 12a–12d, and then the positioning in directions of Z, ω X and ω Y axes by clamping the mask E1 in the direction of the Z axis with three clamping units 13a–13c which constitute a positioning device in combination with the above-mentioned XY positioning device. In this manner, the mask E1 is positioned in the directions of six axes and is stably supported in the EB drawing apparatus or the X-ray exposure apparatus, etc. for semiconductor manufacture.

However, such a mask supporting device of the three-point clamping system is incapable of correcting the shape or position of the mask, by utilizing the temperature or flatness of the mask chuck, in contrast to the case of the vacuum or magnetic chuck, in a case where the membrane generates a distortion such as bending in the course of mask preparation for example on the above-mentioned EB drawing apparatus, or a thermal distortion by the absorption of the energy of the exposing light by the membrane in the course of exposure.

The mask supporting device utilizing the vacuum or magnetic attractive force can resolve the bending or thermal distortion of the mask by regulating the temperature of the mask chuck which is in planar contact with the mask, through temperature control by the supply of temperature regulating liquid in an internal pipe, etc. of the chuck, or preventing the bending of the mask by attracting the mask frame onto the surface of the mask chuck, utilizing the flatness thereof. However in the case of the three-point clamping system, the correction of the mask pattern by the temperature control of the mask chuck is difficult because of the low heat transfer efficiency between the mask and the chuck which are in point contacts.

Consequently, there are provided first to fourth pattern correction devices 21–24 constituting pattern correction means for correcting the deformation or the aberration in position of the pattern P1, by pushing or pulling the external edges of the mask frame H1 in the direction of the X, or Y axis as indicated by arrows L1–L4 in FIG. 3A, thereby bending the rectangular external periphery of the membrane M1.

The pattern correction devices 21–24 are provided, as shown in FIG. 4, with suction pads 21a–24a constituting suction means for sucking lateral edges constituting coupling portions of the mask frame H1, for example by vacuum, and with air cylinders 21b–24b constituting drive means for displacing these suction pads in the X or Y direction. The first pattern correction device 21 is supported, together with positioning members 11a, 11b in the X direction, by a first positioning block 14, while the second pattern correction device 22 is supported, together with positioning members 11c, 11d in the Y direction, by a second positioning block 15. The third pattern correction device 23 is supported, together with pressing members 12a, 12b in the X direction, by a first pressing block 16, while the fourth pattern correction device 24 is supported, together with pressing members 12c, 12d in the Y direction, by a second pressing block 17.

The first and second positioning blocks 14, 15 are screwed on a mask chuck 10, while the first and second pressing blocks 16, 17 are respectively driven in the X and Y directions by driving devices 16a, 17a, such as cylinders, to press the pressing members 12a–12d to the lateral edges of the mask frame H1, thereby achieving the aforementioned positioning. Clamping units 13a–13c are supported on the mask chuck 10 and effect the aforementioned clamping operation by actuators consisting of unrepresented rotary and linear-moving mechanisms.

The first positioning block 14 is fixed to the mask chuck 10, by a screw 14b at the central portion thereof, and is rendered rotatable slightly about screw 14b. This is avoid excessive constriction of the mask E1 by rotating the first positioning block 14, if a rotational moment is generated in the mask E1 for example by the unbalance of the driving forces of the pressing blocks 16, 17 when the mask E1 is positioned by the pressing of the lateral edges thereof by the pressing members 12a–12d.

The pattern correction devices 21–24 are respectively so constructed as to be positioned between the positioning members 11a–11d and the pressing members 12a–12d and to press or pull the central portions of the lateral edges of the mask frame H1, thereby applying a compression or traction force to the mask frame H1 in the X and Y directions, to deform the membrane M1 and correct the shape or the positional aberration of the pattern P1. The correction of the shape and the positional aberration of the pattern P1 can be achieved extremely promptly and exactly by generating the correcting force at such central portions among the positioning members 11a–11d, etc.

The correction of the pattern P1 by the pattern correction devices 21–24 is executed, after the positioning in the directions of X, Y and, ω Z axes with the positioning members 11a–11d and the pressing members 12a–12d and in the directions of Z, ω X and ω Y axes with the clamping units 13a–13c, by detecting the distortion in the vicinity of the lateral edges of the member M1 with alignment marks of the mask E1 and with alignment scopes constituting strain measuring means and controlling the amounts of drive of the cylinders 21b–24b of the pattern correction devices 21–24 by unrepresented control means.

The present embodiment, indirectly correcting the shape and the positional aberration of the pattern on the membrane by applying loads in mutually orthogonal directions to the mask frame, enables precise pattern correction uniformly in the X and Y directions in a safe manner, avoiding troubles such as breakage of fragile membranes under an excessive stress.

Also, as the pattern correction devices 21–24 merely push or pull the lateral edges of the mask by suction with the suction pads, there is not required any change in the shape of the mask for coupling with the pattern correction devices. Consequently, there is not required any complication in the configuration of the mask, which can therefore be made less expensive and longer in the service life.

Figure 5:
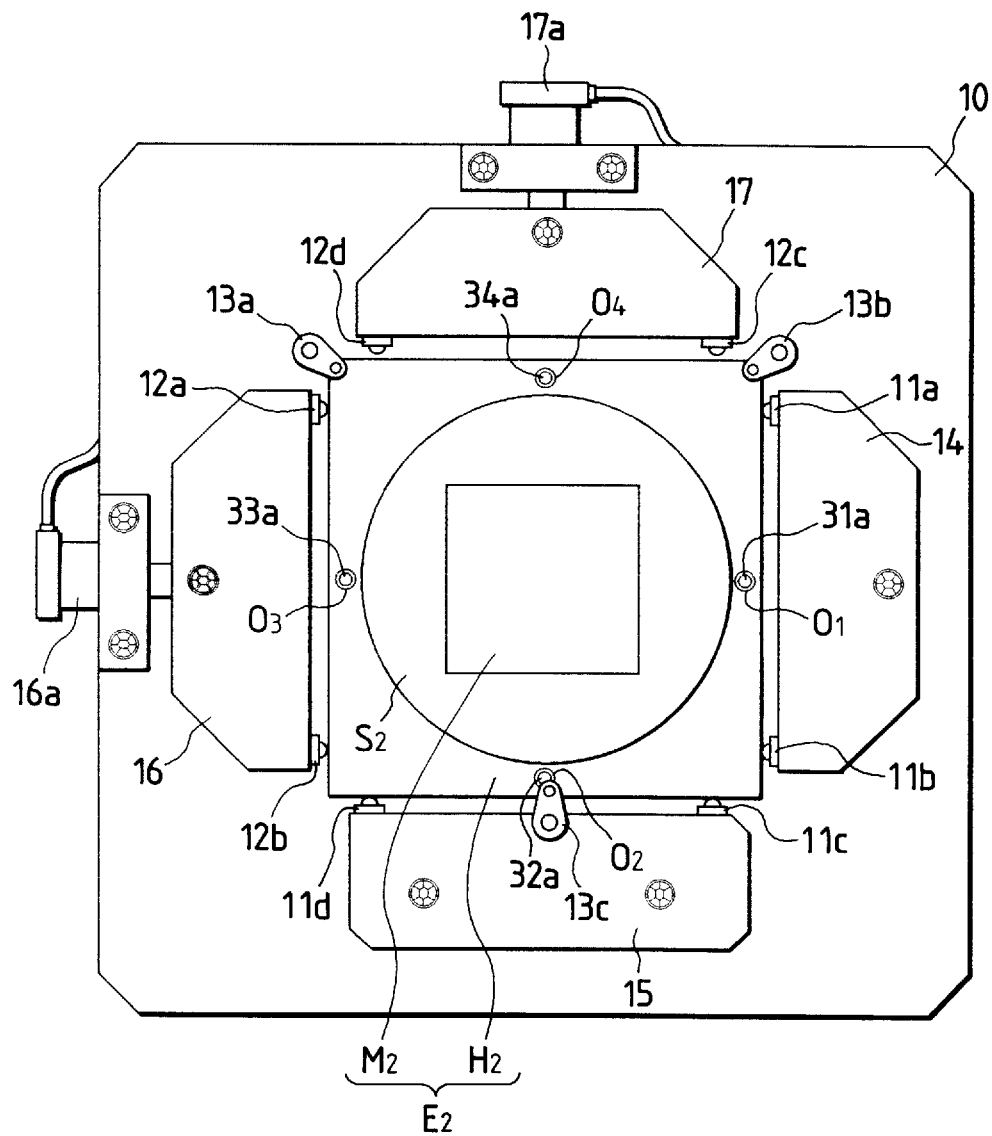
FIG. 5 is a schematic plan view of a mask and a mask supporting device of a third embodiment.
Figure 6:
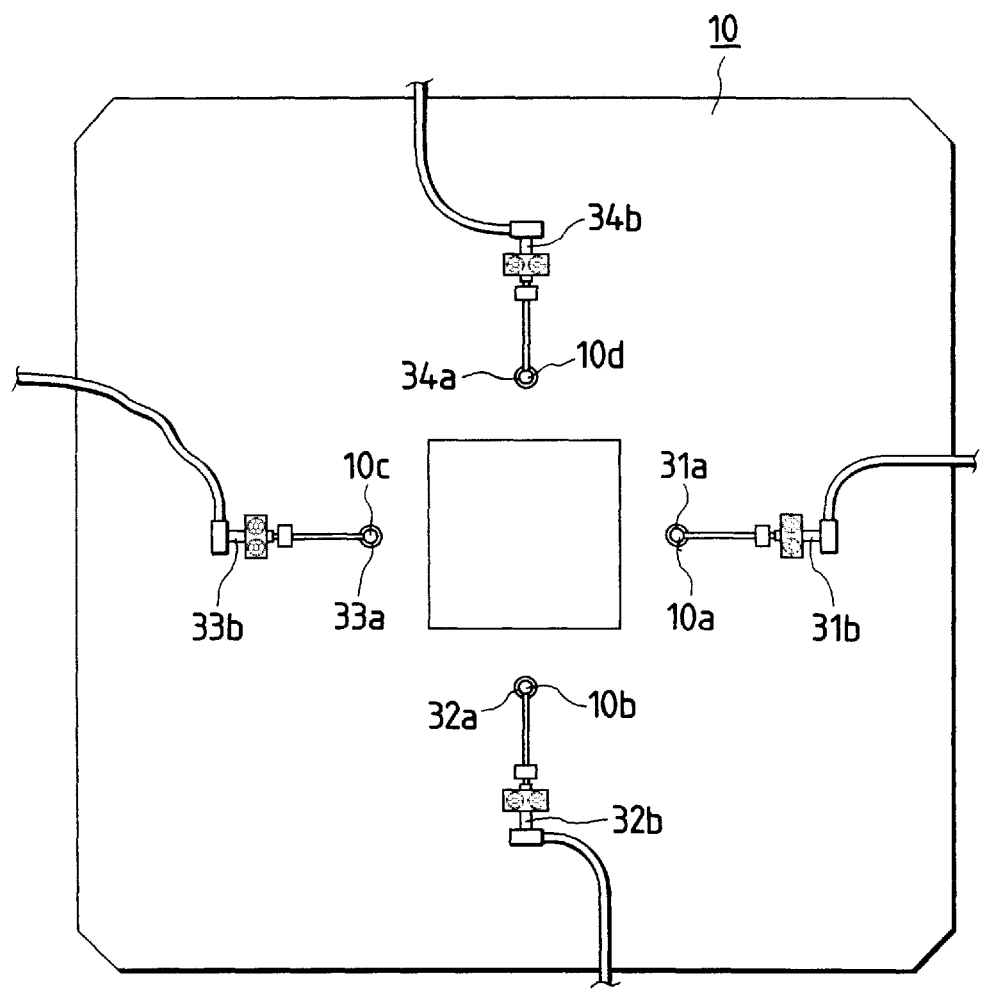
FIG. 6 is a schematic plan view of the device of the third embodiment seen from the rear side.

FIG. 5 shows a mask supporting device, constituting the original supporting device of a third embodiment, wherein the suction pads 21a–24a for sucking the lateral edges of the mask E1 in the second embodiment are replaced by engaging pins 31a–34a, which are engaging members respectively engaging with through holes O1–O4 constituting coupling portions provided on the mask frame H2 of a mask E2 constituting the original. Air cylinders 31b–34b constituting drive means for displacing the engaging pins 31a–34a in the X and Y directions are provided, as shown in FIG. 6, on the rear side of the mask chuck 10, and the engaging pins 31a–34a penetrate the through holes 10a–10d provided in the mask chuck 10 and protrude on the surface thereof as shown in FIG. 7. The mask chuck 10, the positioning members 11a–11d, the pressing members 12a–12d, the clamping units 13a–13d etc., being similar to those in the first embodiment, are represented by the same symbols and will not be explained further.

In the present embodiment, the pattern correction devices are coupled with the mask frame H2 by the engagement of the engaging pins 31a–34a with the through holes O1–O4 of the mask frame H2, so that the coupling of the pattern correction devices with the mask frame is made stronger and the pattern correction can be achieved in stable manner with a higher precision. Other aspects of the configuration are the same as those in the first embodiment.

Figure 9:
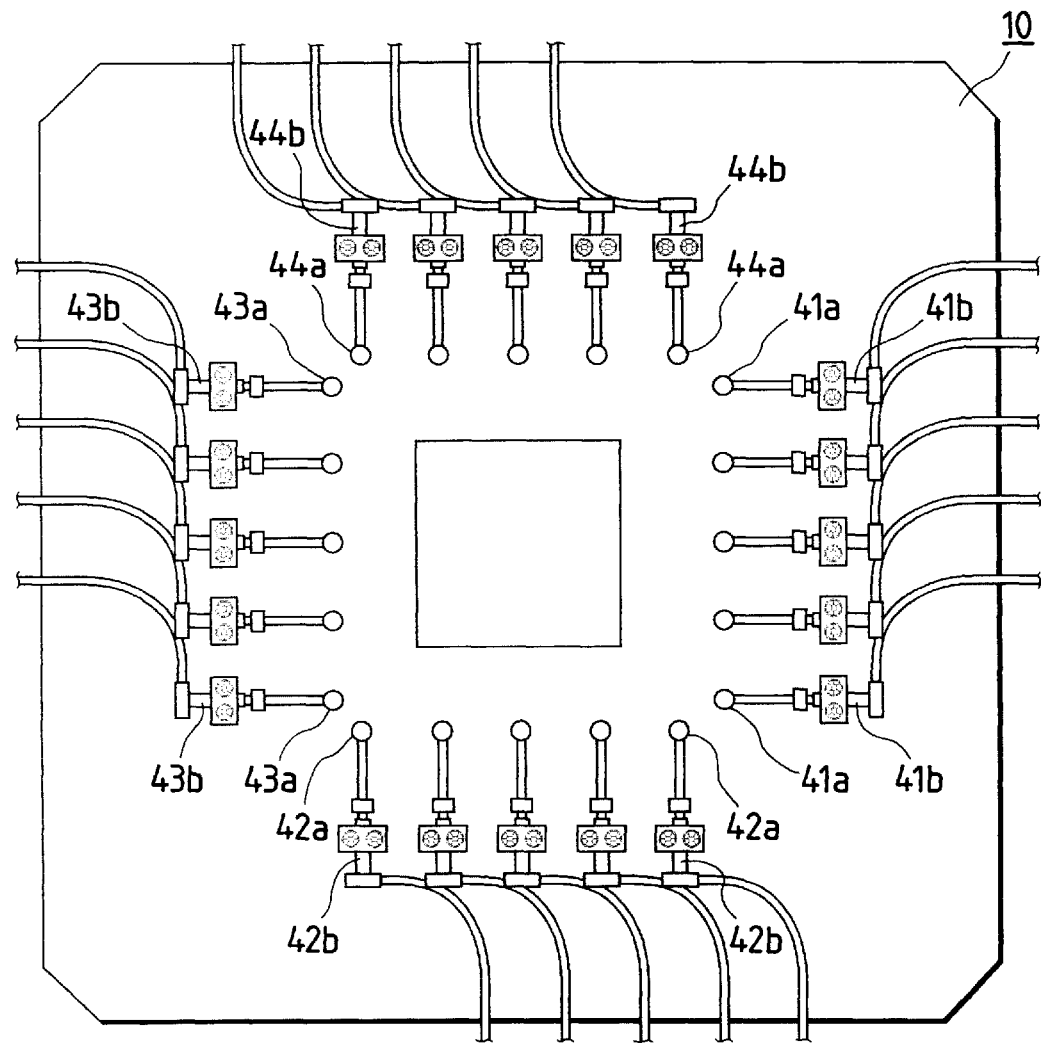
FIG. 9 is a schematic plan view of a mask supporting device in a variation of the third embodiment.

The through holes O1–O4 of the mask frame H2, for engaging with the engaging pins 31a–34a of the pattern correction devices, may be replaced by linear engaging grooves D1–D4 extending, as shown in FIG. 8, along the lateral edges of the mask frame H3 on the rear face thereof and adapted to engage with plural engaging pins 41a–44a shown in FIG. 9. In this case, air cylinders 41b–44b for respectively displacing the plural engaging pins 41a–44a are provided on the top side of the mask chuck 10. The pattern correction devices, having a plurality of engaging pins 41a–44a, can correct the pattern of the mask E3 in a finer manner with a higher precision, and, since the engaging pins 41a–44a, are capable of firmly positioning the mask E3, there can be dispensed with the pressing members 12a–12d and the pressing blocks 16, 17 for positioning the mask E3.

Figure 10:
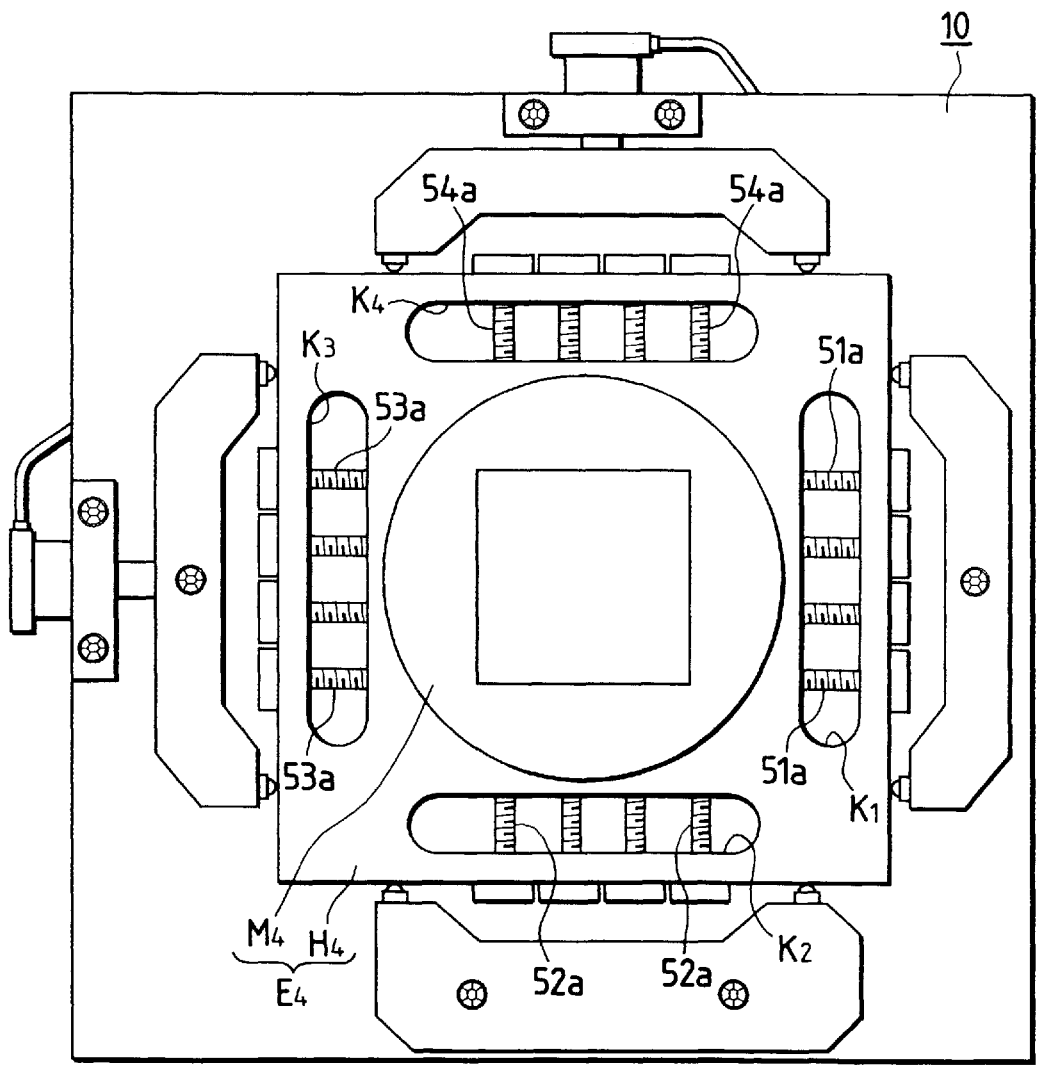
FIG. 10 is a schematic plan view of a mask and a mask supporting device of a fourth embodiment.

FIG. 10 shows a mask E4 constituting the original in a fourth embodiment, wherein the mask frame H4 is provided, along the lateral edges thereof, with elongated holes K1–K4 in the form of cavities, in which plural screws 51a–54a serving as dimension adjusting means are provided, mutually separated along the elongated direction of the holes K1–K4, in such a manner that each of the screws 51a–54a impinges, at the end thereof, on the internal lateral face of each of the elongated holes K1–K4 and engages with a threaded hole provided on the face at the opposite side. Each of such screws 51a–54a may be rotated manually or with an unrepresented jig to adjust the length exposed in the elongated holes K1–K4, thereby varying the length of the screw exposed in the elongated hole and adjusting the width of the elongated holes K1–K4 and causing a deformation in the membrane M4. The formation of the elongated holes K1–K4 reduces the rigidity of the mask frame H4, which is therefore more easily deformable to enable the pattern correction with a higher precision.

Figure 11:
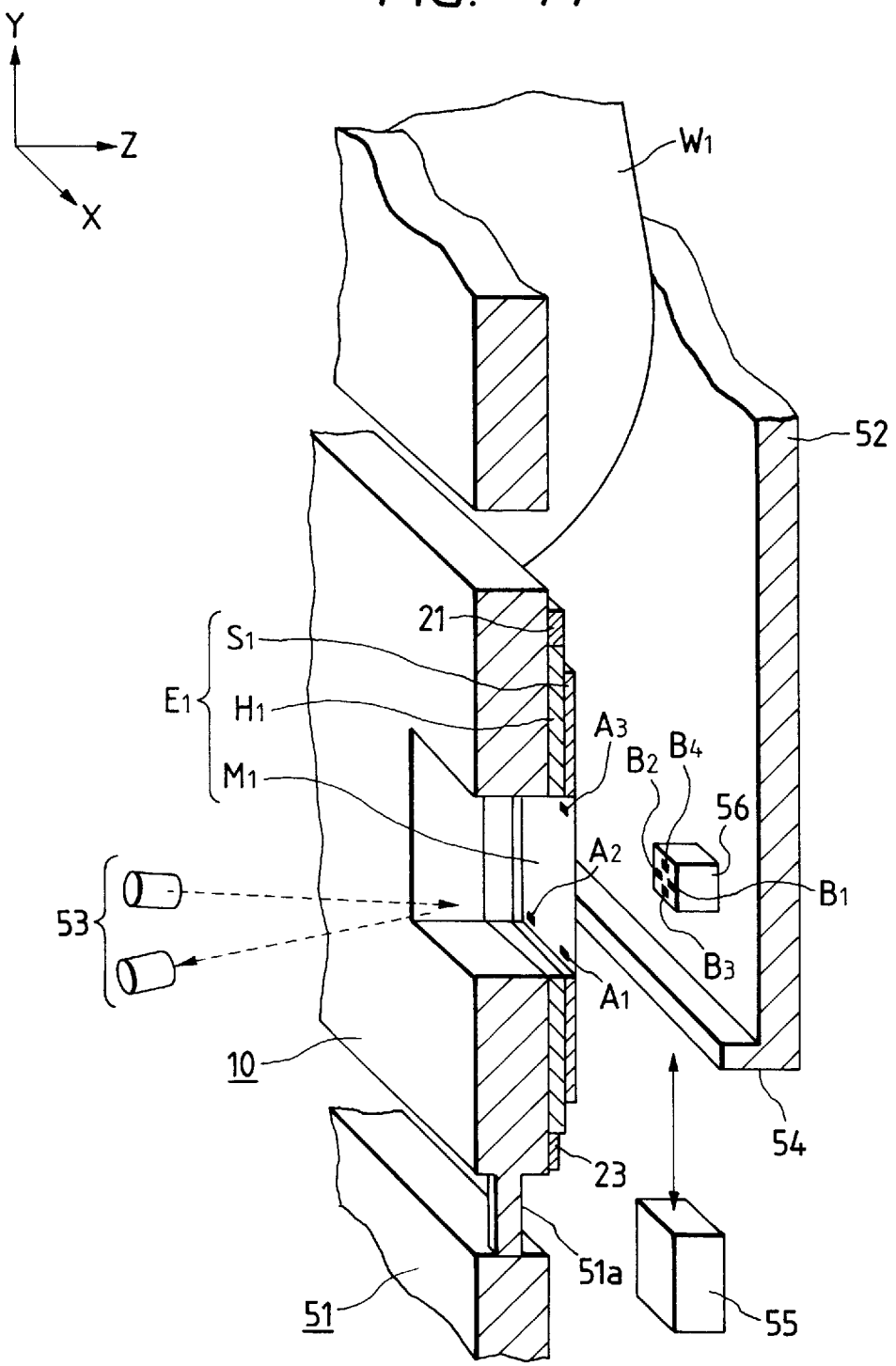
FIG. 11 is a partial schematic view showing a part of an exposure apparatus of the fourth embodiment.

In the following there will be explained, with reference to FIG. 11, a method of detecting the distortion in the membrane M1 of the mask E1, in an exposure apparatus incorporating a mask supporting device. The mask chuck 10 supporting the mask E1 is coupled, by an elastic hinge 51a to an aperture of a mask stage 51 of the exposure apparatus, and the membrane M1 is provided with four alignment marks A1–A4 respectively along the lateral edges thereof. The distortion in the membrane M1 of the mask E1 is measured by observing these alignment marks A1–A4, together with alignment marks B1–B4 provided on a wafer stage 52 supporting a wafer W1 by suction, through an alignment scope 53, then driving the wafer stage 52 in such a manner that the alignment marks A1–A4 of the mask E1 respectively overlap with those B1–B4 of the wafer W1, and detecting the amounts of such drive from the output of an interferometer 55 receiving the light reflected from a mirror 54. The alignment marks B1–B4 of the wafer stage 52 are formed on the Si wafer on a fixed mark member 56 adhered to an end portion of the wafer stage 52.

The process of resolving the deformation or the positional aberration of the pattern of the mask E1 by measuring the distortion of the membrane M1 and automatically driving the air cylinders 21b–24b of the pattern correction devices 21–24 is conducted for example in the following manner. At first the wafer stage 52 is displaced under the observation of the alignment mark A1 of the mask E1 through the alignment scope 53 and it is stopped at a position where the alignment mark B1 of the mark member 56 overlaps with the alignment mark A1 of the mask E1. The amount of drive dx1 of the wafer stage 52 in the X direction is detected from the output of the interferometer 55. Then the wafer stage 52 is displaced until the alignment mark A2 of the mask E1 coincides with that of B2 of the wafer stage 52, and the drive amount dx2 of the wafer stage 52 in the X direction is obtained. Then the difference Δ dx1 between the above-mentioned drive amounts dx1, dx2 is calculated as (dx1–dx 2) and is stored, as the dimension of a lateral edge of the membrane M1, in a memory circuit, together with the drive amount P1 of the air cylinder 23b of the pattern correction device 23. Subsequently, the output of the air cylinder 23b is changed to a new drive amount P2, and, in this situation, measurements are conducted under the alignment scope 53 in a similar manner with the alignment marks A1, A2 of the mask E1 and those B1, B2 of the wafer stage 52, thereby obtaining the dimension Δ dx2 of another lateral edge of the membrane M1. Similar measurements are conducted also for other lateral edges of the membrane M1, and thus obtained data dx1, dx2, P1, P2 etc. are used in the minimum square analysis for determining the optimum drive amounts of the air cylinders 21b–24b for maintaining the lateral edges of the membrane M1 at predetermined values. Thus the air cylinders 21b–24b are controlled with thus obtained optimum drive amounts to eliminate the distortion of the membrane M1, thereby correcting the deformation or the positional aberration of the pattern thereof.

Figure 12:
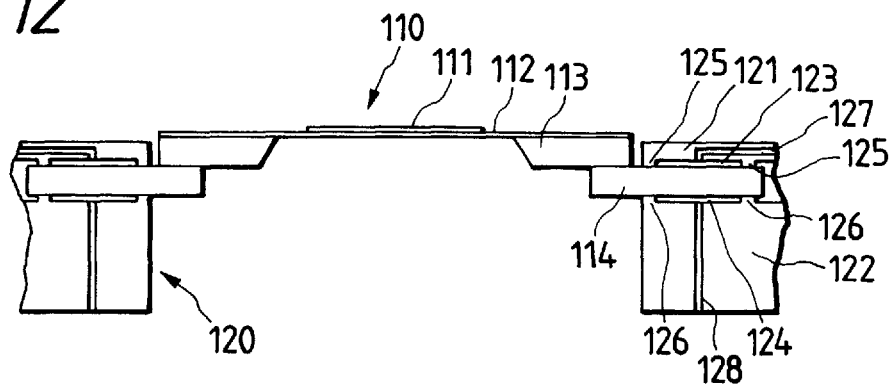
FIG. 12 is a partial cross-sectional view of X-ray mask supporting means in a fifth embodiment of the present invention.

In the following there will be explained, with reference to the attached drawings, an X-ray exposure apparatus constituting a fifth embodiment of the present invention. FIG. 12 is a partial cross-sectional view of X-ray mask supporting means of the present invention, wherein shown are an X-ray mask member 110, a mask pattern 111, a membrane 112, a supporting substrate 113, a supporting frame 114, a supporting member 120, a top surface chuck 121, a rear surface chuck 122, suction grooves 123, 124, impingement portions 125, 126, and suction pipes 127, 128.

The mask pattern 111 is formed with an X-ray absorbing material, particularly with such material of a high X-ray absorption such as W, Ta or alloys thereof, while the membrane 112 (X-ray transmitting film) is composed, for example, of SiC or SiN and serves to support the mask pattern 111. The supporting substrate 113 is formed with an Si wafer and serves to support the mask pattern 111 and the membrane 112. The supporting frame 114, for reinforcing the supporting substrate 113, is adhered thereto, for example, with an adhesive material, and is composed of pyrex glass which is close, in the linear thermal expansion coefficient, to Si, or of a SiC ceramic with a high rigidity.

The supporting substrate 113, having the SiN or SiC film on the surface thereof, is eliminated from the rear face, which is opposite to the mask pattern bearing face, in a square area of a size of 30 to 60 mm, thereby forming an aperture to the X-ray and a membrane 112 consisting of SiN or SiC film in such aperture. On the membrane 112, an X-ray absorbing material for example a metal such as W or Ta is patterned to form the mask pattern 111.

The top surface chuck 121, provided on the supporting member 120, serves to suck the top side (wafer side) of the X-ray mask member 110 of the present embodiment, while the rear surface chuck 122 serves to suck the rear side (light source side) of the X-ray mask member 110. The suction grooves 123, 124 are provided in an annular form, respectively on the top surface chuck 121 and the rear surface chuck 122. The impingement portions 125, 126 are respectively provided on both sides of the suction grooves 123, 124 on the top and rear surface chucks 121, 122 and are formed with a highly precise planarity, in order to avoid leakage of suction when the supporting frame 114 of the X-ray mask member 110 is fixed. The portion of the supporting frame 114, coming into contact with the chucks, is naturally formed with a similar precise planarity.

In the following there will be explained the principle of adjustment with reference to FIGS. 13A and 13B, which are partial magnified cross-sectional views of the chuck portion shown in FIG. 12, respectively showing a sucking state of the suction groove of the rear surface chuck and that of the suction groove of the top surface chuck.

Figure 13A:
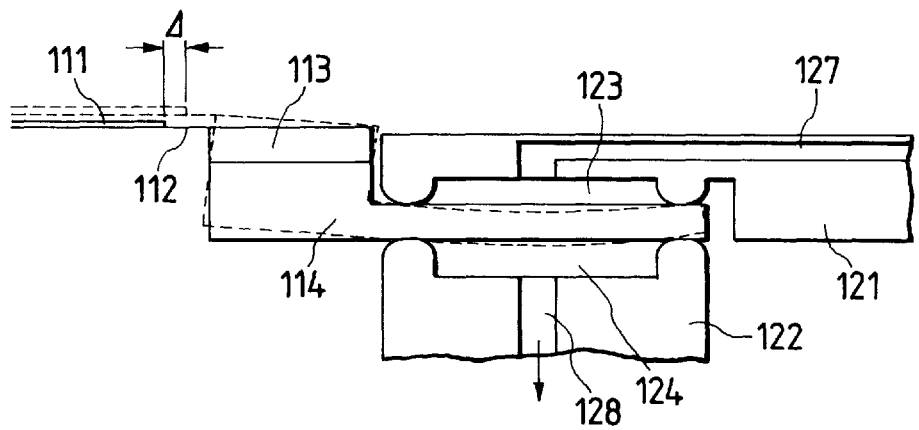
FIGS. 13A and 13B are partial magnified cross-sectional views of a chuck portion in FIG. 12.
Figure 13B:
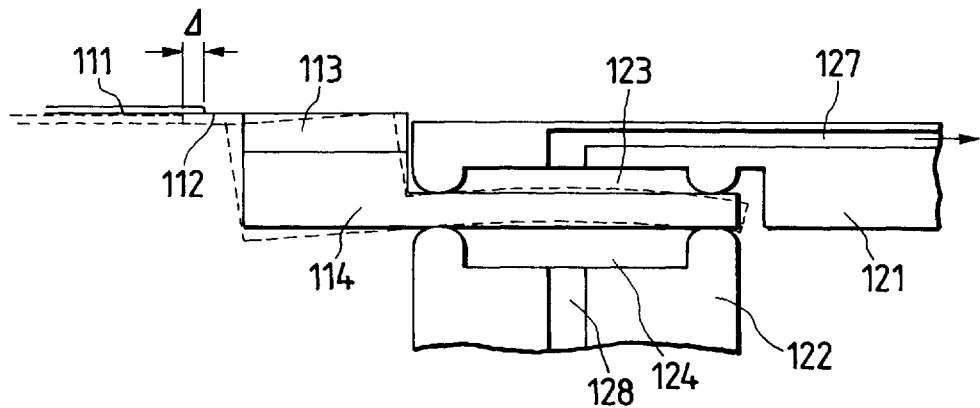

When the air in the suction groove 124 of the rear surface chuck 122 is evacuated by a vacuum pump (not shown) while the X-ray mask member is mounted on the exposure apparatus, the supporting frame 114 causes a deformation, concave toward the top surface chuck as shown in FIG. 13A, whereby the mask substrate 113 is deformed toward the top surface to expand the mask pattern 111 on the membrane 112. In this state the suction force of the top surface chuck 121 is turned off. On the other hand, when the air or the exposure atmosphere gas (such as He) in the suction groove 123 of the rear surface chuck 121 is evacuated by a vacuum pump (not shown) while the X-ray mask member is mounted on the exposure apparatus, the supporting frame 114 causes a deformation, convex toward the top surface chuck as shown in FIG. 13B, whereby the mask substrate 113 is deformed toward the rear surface to reduce the mask pattern 111 on the membrane 112. In this state the suction force of the rear surface chuck 122 is turned off.

With a thinner edge of the supporting frame 114 of the X-ray mask member 110, the flexibility becomes higher to provide a larger amount of correction of the magnification with a low suction force. Also a larger suction area provides a larger amount of correction of the magnification with a low suction force.

Figure 14:
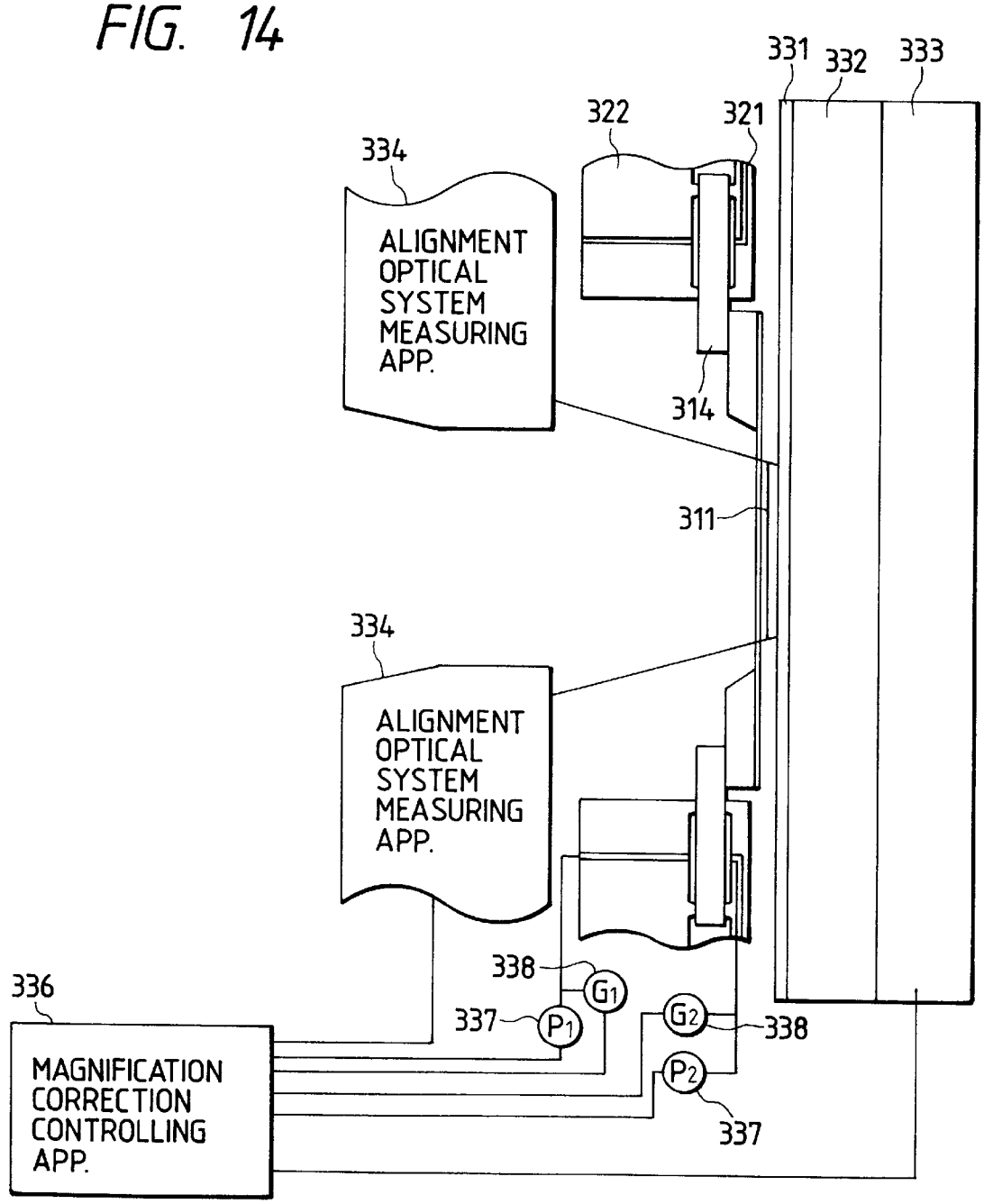
FIG. 14 is a schematic view showing an exposure apparatus incorporating the X-ray mask supporting means of the fifth embodiment of the present invention.

In the following there will be explained the state of incorporation of the above-explained mechanism in the exposure apparatus. FIG. 14 is a schematic view showing such a state, wherein shown are a mask pattern 311, a supporting frame 314, a top surface chuck 321, a rear surface chuck 322, a wafer 331, a wafer chuck 332, a wafer stage 333, an alignment optical system measuring device 334, a magnification correction controlling device 336, a vacuum pump 337 and a vacuum gauge 338.

As already shown in FIG. 12, the supporting frame 314 of the X-ray mask member is fixed by being sandwiched between the rear surface chuck 321 and the top surface chuck 322. The alignment optical system measuring device 334 executes the alignment of the alignment marks (not shown) provided on the mask pattern 311 and the wafer 331, which are set at a distance of a proximity gap. The wafer 331 is fixed on the wafer stage 323 by the wafer chuck 332. The result of measurement by the alignment optical system measuring device 334 is inputted into a magnification correction controlling device 336.

The magnifications of the mask pattern and the pattern on the wafer are compared by observing at least two alignment marks with the alignment optical system measuring device and by measuring the distance (magnification) between the alignment marks. If the mask pattern is smaller than the pattern on the wafer, the suction force of the rear surface chuck 322 is increased to expand the mask pattern. On the other hand, if the mask pattern is larger than the pattern on the wafer, the suction force of the top surface chuck 321 is increased to reduce the mask pattern. The vacuum levels of the chucks are controlled by the magnification correction controlling device 336, together with the vacuum pump 337 (P1, P2), under monitoring with the vacuum gauge 338 (G1, G2).

The above-explained mechanism, allowing to obtain a mask deformation for correcting the mask magnification by a change in the suction force of the chucks, dispenses with the complex driving mechanisms in the conventional art.

Figure 15A:
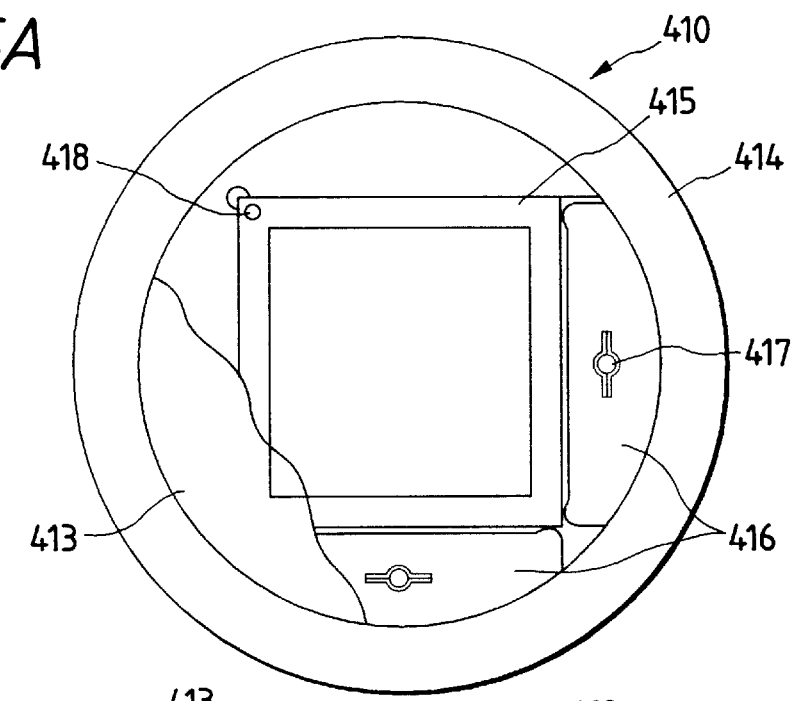
FIGS. 15A to 15C are schematic views of X-ray mask supporting means in a sixth embodiment of the present invention.
Figure 15B:
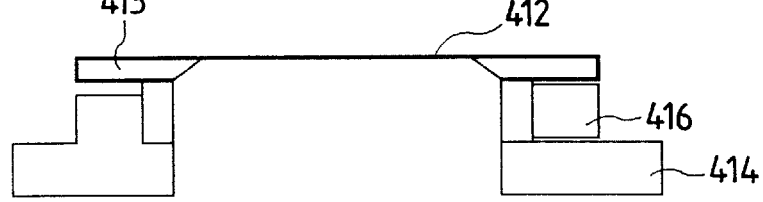
Figure 15C:
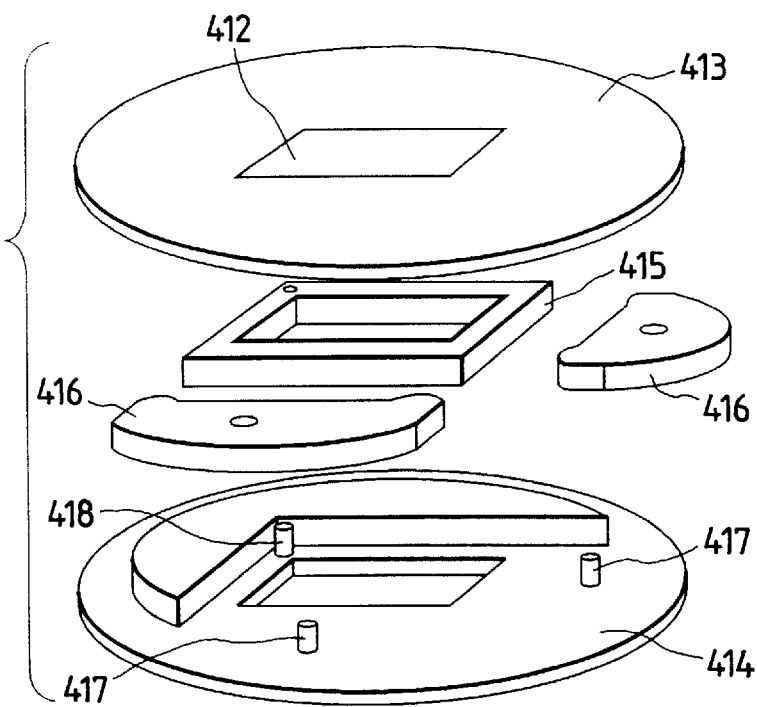

In the following there will be explained a sixth embodiment of the present invention with reference to FIGS. 15A, 15B and 15C, which are respectively a schematic plan view, a schematic cross-sectional view and a schematic perspective view, wherein shown are an X-ray mask member 410, a membrane 412, a supporting substrate 413, a base frame 414, a sub frame 415, transmission members 416 and pins 417, 418.

The mask pattern of the X-ray mask of the present embodiment is prepared, in the patterning process thereof, with a size slightly larger than that of the ideal mask pattern. The offset in the magnification of the pattern is determined from the process distortion anticipated in the wafer process after the pattern transfer.

The sub frame 415, featuring the present embodiment, is composed of a frame-shaped square supporting frame, and is preferably composed of a material of a higher rigidity than that of the supporting substrate 413, for example SiC in the present embodiment. The sub frame 415 is fixed by adhesion to the supporting substrate 413, outside a back-etched area for forming the membrane 412. In preparation of the X-ray mask member 410, the sub frame 415 is adhered to the supporting substrate 413 before the back etching thereof, in order to prevent bending thereof resulting from the strain by the membrane after the back etching. It is also possible to perform the back etching after the supporting substrate 413 is cut in advance in a shape the same as that of the sub frame 415 and is adhered thereto.

Such a shape of the mask substrate is also effective for avoiding the contact between the X-ray mask and the wafer, resulting from a tilted relation therebetween in case of an equal-size proximity exposure.

In the present embodiment, the base frame 414 is composed, like the sub frame 415, of a material of a high rigidity such as SiC. In the present embodiment the base frame 414 has a circular shape, and the sub frame 415 and the base frame 414 are coupled at a single point of a pin 418, in order that they are in a substantially close contact at the contacting faces thereof.

The transmission members 416 serve to transmit the driving force of the magnification correcting mechanism, provided on a support member of the X-ray exposure apparatus, to the supporting substrate 413 through the sub frame 415. The transmission members 416 are mounted, in a slightly movable manner, by the pin 417 on the base frame 414. In order to transmit the external force to the sub frame 415, an elastic member (such as a plate spring) is provided between the pin 417 and the transmission member 416 to render the transmission member 416 movable toward the direction of the external force. Such a plate spring employed in the present embodiment may also be replaced by another suitable means. The transmission member 416 has protruding portions, so as to push two corner points of each beam constituting the rectangular sub frame 415.

The above-explained mounting method of the transmission members 416 allows to apply the external force from a single position uniformly onto two corner positions of the sub frame 415. As the external forces are applied to the sub frame 415 along the directions of two orthogonal axes, there are provided two sets of the transmission members 416 in mutually orthogonal manner on the base plate 414. Since the sub frame 415 and the transmission member 416 are in mutual contact but not mutually connected, the freedom of movement in a direction perpendicular to the direction of the external force is secured by the slippage between the sub frame 415 and the transmission member 416, so that the mutually orthogonal external forces applied to the sub frame 415 can be transmitted thereto without mutual interference.

Figure 16:
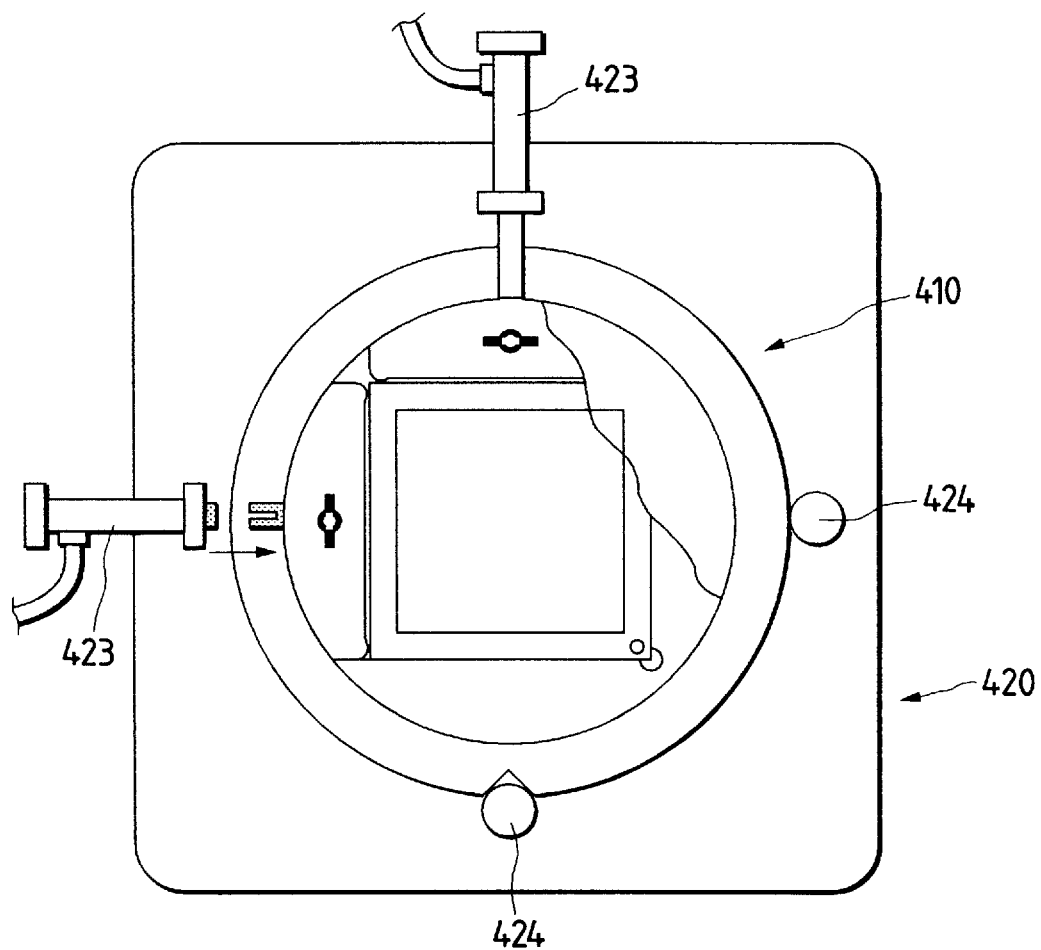
FIG. 16 is a schematic plan view of the X-ray mask supporting means of the sixth embodiment employed in the above-shown X-ray exposure apparatus.

FIG. 16 is a schematic plan view of the X-ray mask supporting means, wherein shown are an X-ray mask member 410, a supporting member 420, actuators 423 and positioning pins 424.

The X-ray mask member 410 is transported to and placed on the supporting member 420, by an unrepresented X-ray mask transport mechanism. The positioning of the mask on the supporting member 420 is achieved, in the present embodiment, by two positioning members. As shown in FIG. 16, the X-ray mask member 410 is provided with positioning notches in the base frame 414 (FIGS. 15A, 15B and 15C). In the present embodiment, the X-ray mask member 410 is supported, after positioning thereof, by a vacuum chuck, but there may also be employed a mechanical chuck or a magnetic chuck.

The actuators 423 are provided for correcting the magnification, and provided in two sets on the supporting member 420 in mutually orthogonal manner, so as to act on the transmission members 416 of the X-ray mask member 410 supported on the supporting member 420. The actuators in the present embodiment utilize air cylinders as the drive source. As the pressure applied to the air cylinder drives the actuator 423, the pattern magnification of the X-ray mask member 410 is controlled by such driving pressure, but there may also be adopted another drive controlling method. The front end of the actuator 423, contacting the transmission member 416, is retracted at the mounting operation of the X-ray mask member 410 in order not to hinder the transportation thereof.

The X-ray mask member 410 mounted and supported on the supporting member 420 is subjected, prior to the pattern transfer by exposure, to the detection of the amounts of aberration from the positioning mark of a wafer 431, receiving such pattern transfer, by an unrepresented mask alignment system, and correction values for the transfer magnification, representing the distortion between the pattern size of the X-ray mask member 410 and the pattern to be transferred onto the wafer 431, are determined by statistical processing of such amounts of aberration. The mutually orthogonal actuators 423 are respectively driven according to such determined values, thereby controlling the pressures applied to the respective transmission members 416 of the X-ray mask member 410. These pressures are applied to the beams constituting the sub frame 415 to cause an isotropic deformation of the sub frame 415, thereby inducing a similar isotropic deformation in the membrane 412 of the supporting substrate 413 adhered to the sub frame 415. The pressure control of the actuators 423 may also be made under the observation of the alignment marks. Also the time required for the correction of magnification can be reduced by measuring, in advance, the relationship between the pressure applied to the X-ray mask member 410 and the rate of resulting pattern contraction and executing the pressure control based on such measured relationship.

The X-ray mask supporting means of the present embodiment is featured by the utilization of a small elastic deformation of a square supporting frame, or, stated differently, the utilization of-a structure equivalent to uniform compression springs placed on four sides, and by inducing linear deformation of the compression springs by pressurizing at the four corners to achieve a uniform compression deformation.

As explained in the foregoing, the present embodiment allows to match the size of the X-ray mask pattern to be transferred with the exposure size on the wafer 431 by varying the pressures applied to the mutually orthogonal two points of the supporting substrate 413, thereby simplifying the configuration of the X-ray mask supporting means. As the control of the pattern magnification in the present embodiment is achieved by isotropic compression of the mask pattern of the X-ray mask, such mask pattern is prepared with a slightly larger size as explained before.

By incorporating the X-ray mask supporting means of the present embodiment in an X-ray exposure apparatus provided with an exposure transfer magnification correcting mechanism capable of applying an in-plane stress to the X-ray mask, the isotropic magnification control, which has been difficult to achieve in the prior art, can be easily realized by a magnification control mechanism for pressing mutually orthogonal two points of the X-ray mask. Thus, the magnification correcting mechanism of the X-ray exposure apparatus can be realized in a simple configuration and a device manufacturing apparatus utilizing such X-ray exposure apparatus can produce the highly precise semiconductor devices in an efficient manner.

Figure 17A:
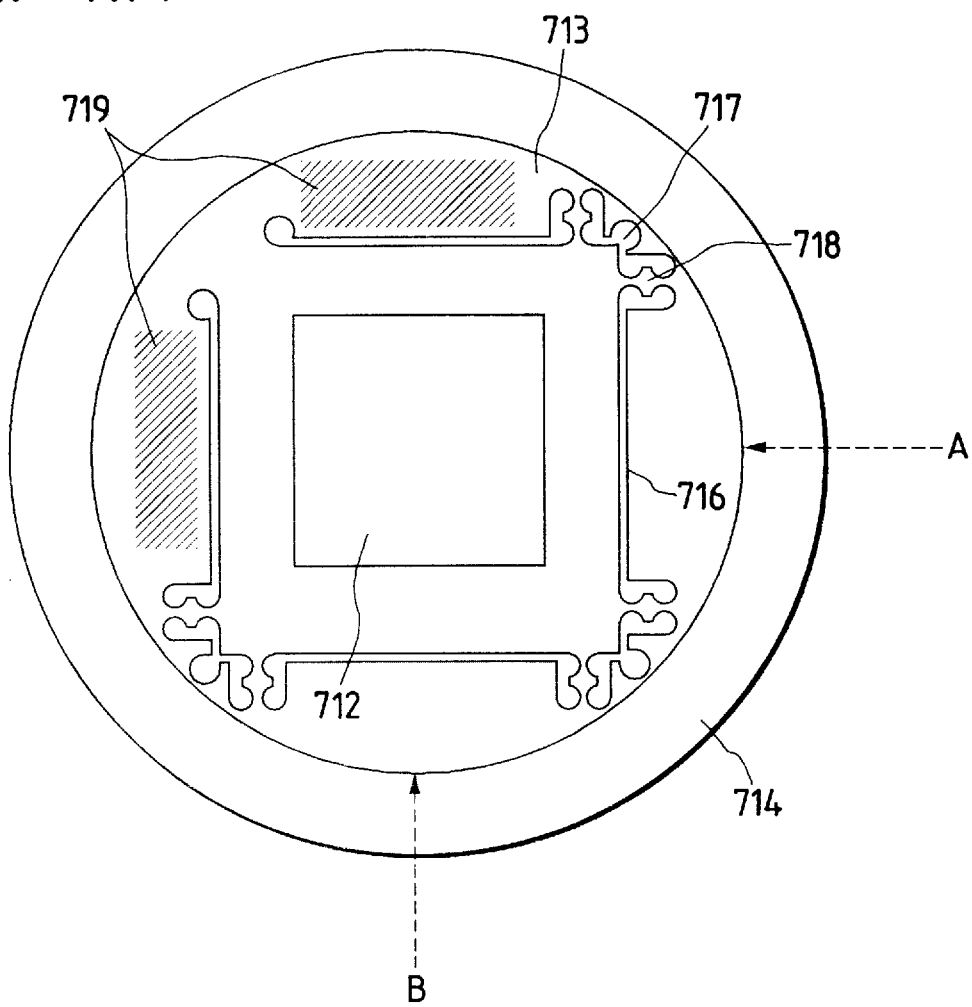
FIGS. 17A and 17B are schematic views of an X-ray mask member of an X-ray mask supporting means in a seventh embodiment of the present invention.

In the following there will be explained a seventh embodiment of the present invention with reference to FIGS. 17A and 17B, which are respectively a schematic plan view and a schematic cross-sectional view of an X-ray mask member, wherein shown are a membrane 712, a supporting substrate 713, a supporting frame 714, first grooves 716, second grooves 717, elastic hinges 718, and adhered fixing portions 719.

Components named the same as in the foregoing embodiment will not be explained further. The supporting substrate 713 incorporates therein the sub frame 415 and the transmission members 416 of the sixth embodiment, in combination with the supporting substrate 413. The supporting substrate 713 is provided thereon with first grooves 716 for stress relaxation, formed for example by etching so as to surround the central membrane 712 as shown in FIGS. 17A and 17B, whereby the membrane 712 is supported by a square frame-shaped part of the supporting substrate 713. Then the second grooves 717 are formed on the three corners of the square frame, and the elastic hinges 718, connecting the square frame surrounding the membrane 712 with the external peripheral part of the supporting substrate 713 are formed in three corner portions of the supporting substrate.

Such elastic hinge 718 is so formed as to have a rigidity in a direction perpendicular to the bending direction, significantly larger than the rigidity in the bending direction. The supporting substrate 713 and the supporting frame 714 are mutually fixed by adhesion in the fixing portions 719 in the peripheral area of the supporting substrate 713, positioned, as indicated by hatched areas in FIG. 17A, on both sides of a corner lacking the second groove 717.

Figure 17B:
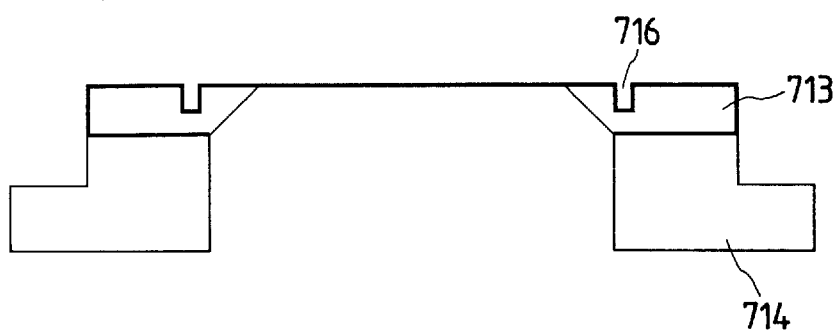

In the present embodiment, the external forces applied to the membrane 712 for adjusting the magnification are directly transmitted to the supporting substrate 713, from directions A, B shown in FIG. 17B. The externals forces from the directions A, B act, through the elastic hinges 718, on the square frame, formed inside the grooves 716 on the supporting substrate 713. Owing to the configuration shown in FIG. 17A of the elastic hinges 718, having the above-explained rigidity, the external forces in the mutually orthogonal directions A, B are transmitted, without mutual interference, to the interior of the first grooves 716, whereby the mask pattern on the membrane 712 causes isotropic compression deformation. Therefore, in the present embodiment, the sub frame (square support member) 415 in the sixth embodiment is incorporated in the supporting substrate 413. The external forces can be efficiently transmitted to the beams if the pressures of such external forces are applied to the peripheral positions of the supporting substrate 713 corresponding to the centers of the beams constituting the square supporting frame in the supporting substrate 713.

In the present embodiment, the supporting substrate 413 of the sixth embodiment is also given the functions of the sub frame 415 and the transmission members 416 to simplify the preparation and the assembly of the X-ray mask, whereby provided is an inexpensive X-ray mask with magnification correcting function.

In the following there will be explained an eighth embodiment of the present invention with reference to FIGS. 18A and 18B, which are respectively a schematic plan view and a schematic cross-sectional view of an X-ray mask member, wherein shown are an X-ray mask member 810, a membrane 812, a supporting substrate 813, a supporting frame 814, strain gauges 816, electrodes 817 and signal line patterns 818.

The supporting frame 814 for the supporting substrate 813 is formed in a circular shape in the present embodiment, and the center of the circle substantially coincides with the center of the exposure image angle. In the supporting frame 814, there are embedded unrepresented magnetic members, which are magnetically attracted by magnets installed on the supporting member to support the supporting frame in the exposure apparatus.

The strain gauges 816 are provided on the rear face of the supporting substrate 813 and serve to detect the strain therein. The detected signals are taken out to the exterior through the signal line patterns 818 and the electrodes 817.

The strain gauges 818 are provided in four units, respectively at the outside of and along the four sides of the back-etched area for forming the membrane 812, on the rear face of the supporting substrate 813. The two gauges positioned top and bottom in FIG. 18A detect the strain in the X direction, while those two positioned at right and left detect the strain in the Y direction. The two ends of each of the strain gauges 816 are connected through the signal line patterns 818 to the electrodes 817, and a signal obtained therefrom enables an external strain gauge control unit to measure the strain measured by the strain gauge 816. The electrodes 817 and the signal line patterns 818 are formed with an electrically conductive material.

Figure 18A:
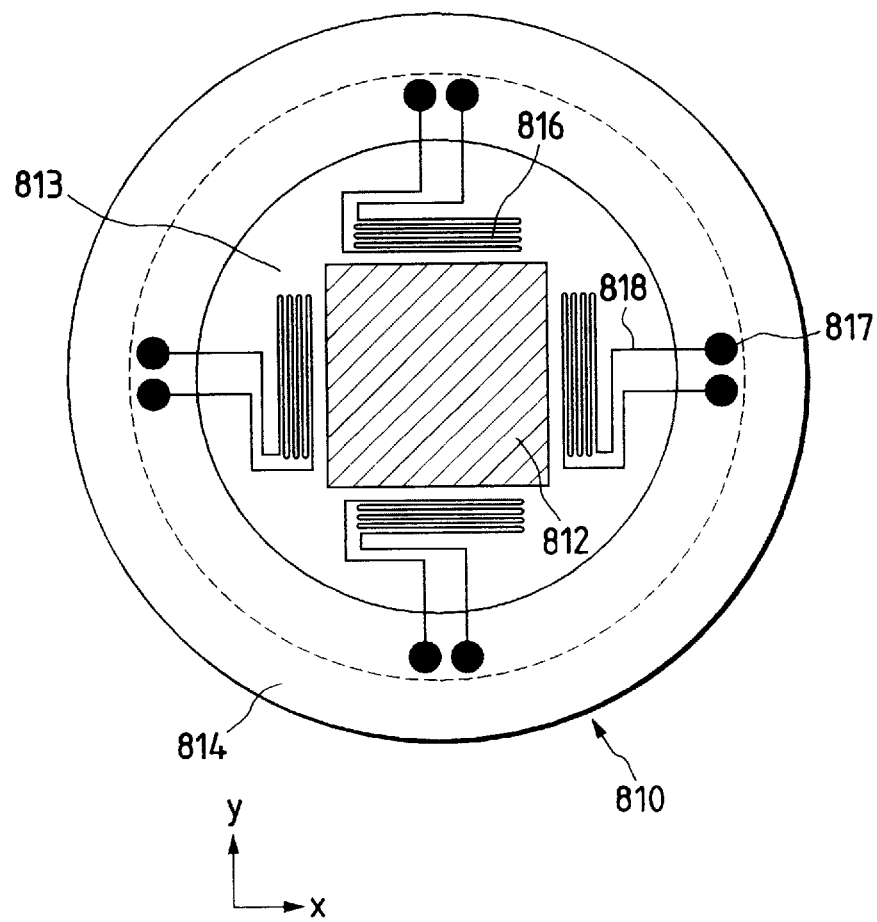
FIGS. 18A and 18B are schematic views of an X-ray mask provided with a strain gauge in an eighth embodiment of the present invention.
Figure 18B:
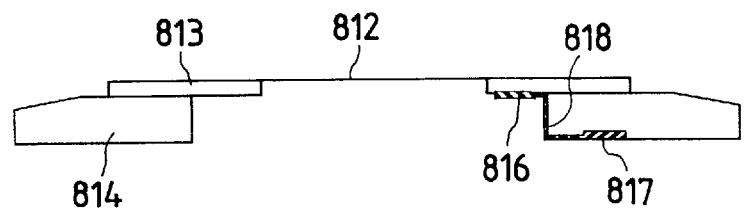
Figure 19:
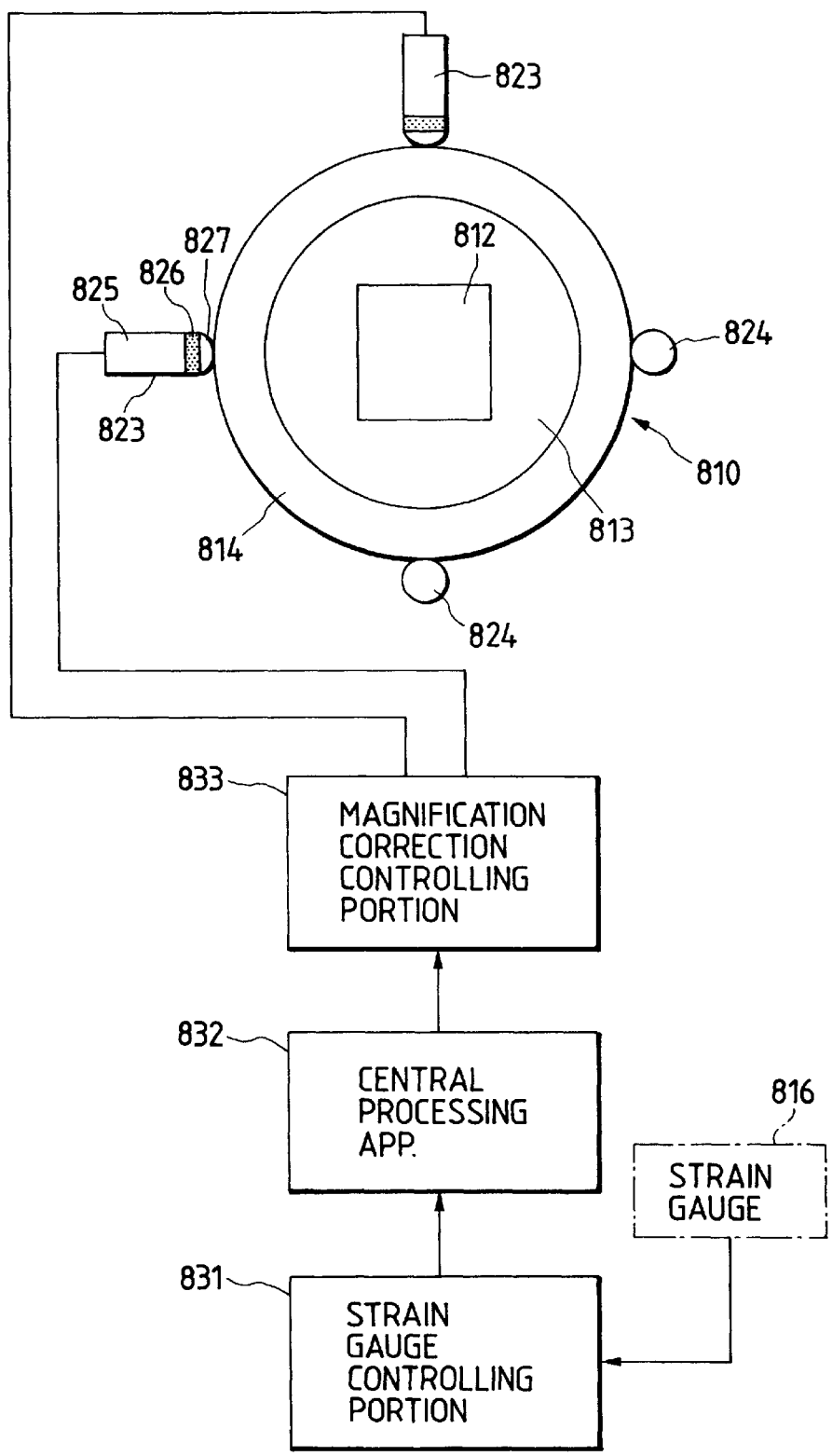
FIG. 19 is a schematic view of a magnification correcting device utilizing the X-ray mask member shown in FIG. 18.
Figure 20:
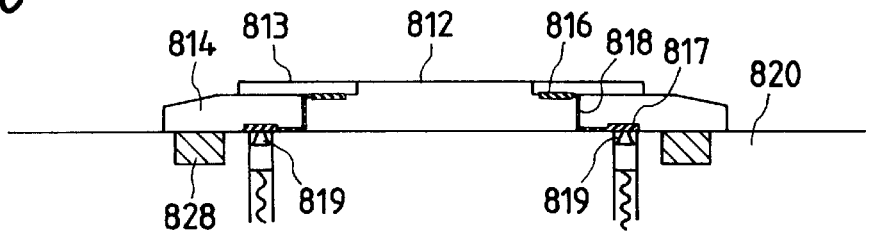
FIG. 20 is a cross-sectional view showing a state in which the X-ray mask member shown in FIGS. 18A and 18B is fixed to a support member.

FIG. 19 is a schematic view of a magnification correcting device utilizing the X-ray mask member shown in FIGS. 18A and 18B, and FIG. 20 is a cross-sectional view showing a state where the X-ray mask member shown in FIGS. 18A and 18B is fixed on a supporting member. In these drawings there are shown an X-ray mask member 810, a membrane 812, a supporting substrate 813, a supporting frame 814, strain gauges 816, electrodes 817, signal line patterns 818, support-side electrodes 819, a supporting member 820, actuators 823, positioning pins 824, supporting portions 825, electrostriction elements 826, impingement portions 827, electromagnets 828, a strain gauge control unit 831, a central processing unit 832 and a magnification correction controlling unit 833.

The X-ray mask member 810 is magnetically chucked on the supporting member 820, in a state where the lateral face of the supporting frame 814 impinges on the positioning pins 824. In the supporting member 820, electromagnets 828 are embedded to magnetically attract the supporting frame of the mask. In a part of the attracting surface, there are provided the support-side electrodes 819 in an arrangement corresponding to that of the electrodes 817 of the X-ray mask member 810, whereby, in the attracted state, the signals from the strain gauges 816 are supplied to the external strain gauge control unit 831.

The magnification correcting mechanism achieves the correction by pressing, in the planar direction, the supporting frame 814 by means of the actuators 823, each of which is composed of a support portion 825, an electrostriction element 826, and an impingement portion 827. In response to an instruction signal from the magnification correction controlling unit 833, the electrostriction element 826 is extended to pressurize the supporting frame 814 by the impingement portion 827. The actuators 823 are provided in positions opposed to the positioning pins 824, and are so positioned as to generate pressurizing forces toward the center of the mask. The respective controls of the actuators 823 allow to control the strains in the X and Y directions independently.

Based on the signals from the strain gauges 816 provided in the X-ray mask member 810, the strain gauge control unit 813 measures the strains, which are then transmitted to the central processing unit 832. In response the central processing unit 832 sends an instruction signal to the magnification correction controlling unit 833 so as to obtain desired strains, and the magnification correction controlling unit 833 drives the actuators 823 to induce a distortion in the X-ray mask member 810.

In the following there will be explained the exposure process, utilizing the above-explained X-ray mask member 810 and an exposure apparatus provided with a magnification correcting mechanism. At first the X-ray mask member 810 is loaded and supported on the supporting member 820.

Then a wafer for receiving the pattern transfer is loaded and subjected to global alignment, in which the alignment is made on a part of the shot areas on the wafer for determining the rotation, positional aberration, magnification etc. of the entire wafer. Among thus determined results, the magnification is corrected by the magnification correcting means explained above. The correction of the magnification is executed, based on the results of measurements by the strain gauges 816 provided on the X-ray mask member 810. The wafer is moved to a first shot position while the correction of the mask is conducted, and an exposure operation is then executed. Thereafter the wafer is moved to a next exposure position, and the exposure operation is thus repeated for the entire wafer.

Since the measurement by the strain gauges is independent from the drive of the wafer stage, the wafer stage and the magnification correcting operation can be simultaneously activated in a parallel manner, whereby the exposure operation can be executed without the loss in the throughput.

In the following there will explained a ninth embodiment of the present invention, with reference to FIGS. 21A and 21B which are respectively a schematic plan view and a block diagram, wherein shown are an X-ray mask member 1110, a membrane 1112, a supporting substrate 1113, a supporting frame 1114, strain gauges 1116, positioning pins 1124, a strain gauge control unit 1131, a central processing unit 1132, other peripheral equipment 1133, and mask transporting means 1136.

The structure of the X-ray mask member 1110 is the same as that shown in FIGS. 18A and 18B. As in the chucking mode in the eighth embodiment shown in FIG. 20, the signals from the strain gauges 1116 are taken out to the exterior. The related configuration will be explained further as it is the same as in the eighth embodiment.

Figure 21A:
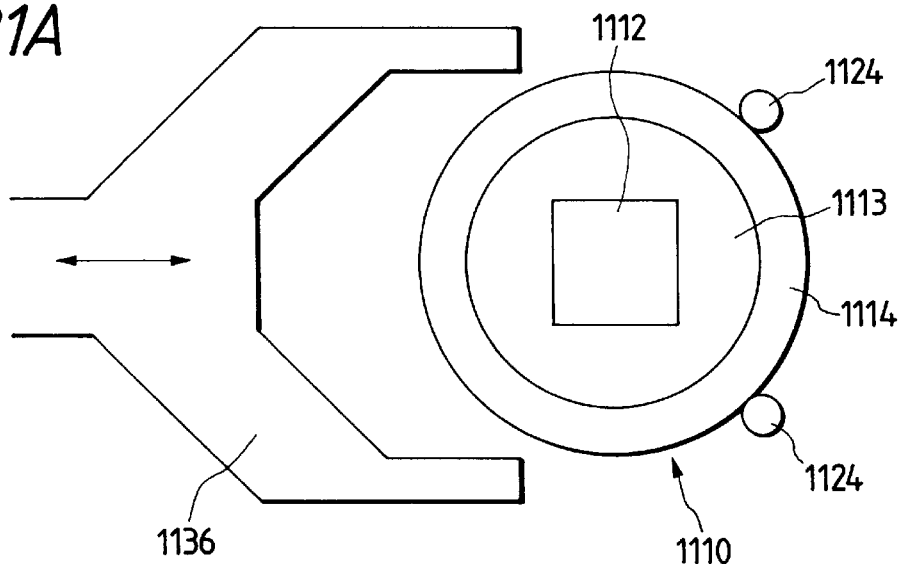
FIGS. 21A and 21B are schematic views of a ninth embodiment of the present invention.
Figure 21B:
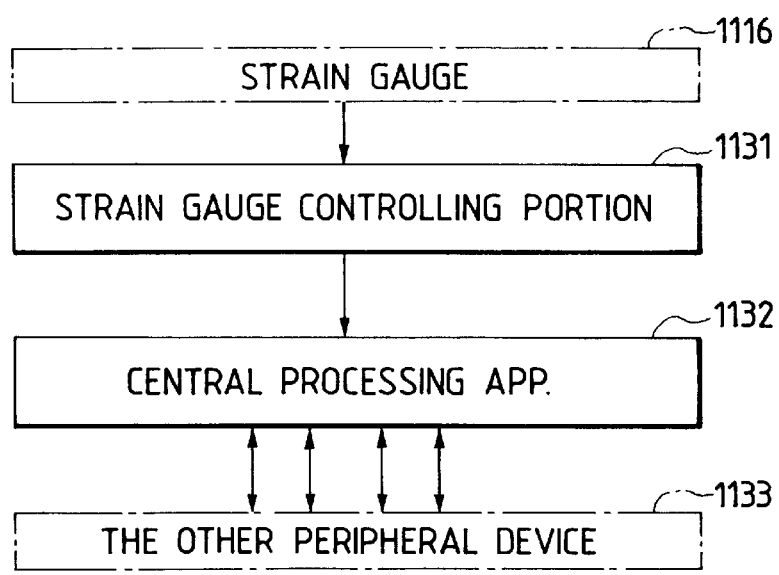

Now reference is made to FIGS. 21A and 21B for explaining the present embodiment. The X-ray mask member 1110 is taken out from an unrepresented mask holder by the mask transporting means 1136 and is transported to the mask supporting member. The mask transporting means 1136 positions the X-ray mask member 1110 by impingement thereof on the positioning pins 1124, whereupon the X-ray mask member 1110 is magnetically attracted by the electromagnets. Subsequently, the strain gauges 1116 measure the distortion in the mask. The strain gauge control unit 1131 calculates the amount of distortion and sends the result to the central processing unit 1132, which in response discriminates whether such distortion is within a predetermined range, and, if within such range, the exposure operation is performed. However, if outside the range, the X-ray mask member has been distorted by the chucking operation. Therefore, the central processing unit 1132 sends an instruction to the mask transporting means to repeat the chucking operation, in order to retain the distortion within the predetermined range. If the distortion is not reduced to such a range after the repeated chucking operation, the central processing unit 1132 releases an error signal, for informing the user of an abnormality generated in the mask itself.

A distortion causes a positional aberration in the circuit pattern, thus deteriorating the precision of pattern alignment and lowering the production yield of the devices. The present embodiment minimizes the loss of production yield resulting from the pattern distortion, by monitoring the distortion at the chucking operation by means of the X-ray mask member 1110 incorporating the strain gauges 1116 and repeating the chucking operation in case the distortion exceeds a predetermined value. It is also rendered possible to avoid the exposure operation executed in the presence of such distortion.

The reference values for judging such distortion are composed, for example, of the outputs of the strain gauges obtained at the pattern drawing on the mask, etc., since such values allow retention of the state of the mask at such pattern drawing operation.

The foregoing embodiments have described the mask chucking in the X-ray exposure apparatus, but these embodiment are naturally applicable also to the substrate chucking in exposure apparatus utilizing an exposure energy other than X-ray, or in an electron beam drawing apparatus or a length measuring apparatus.

Figure 22:
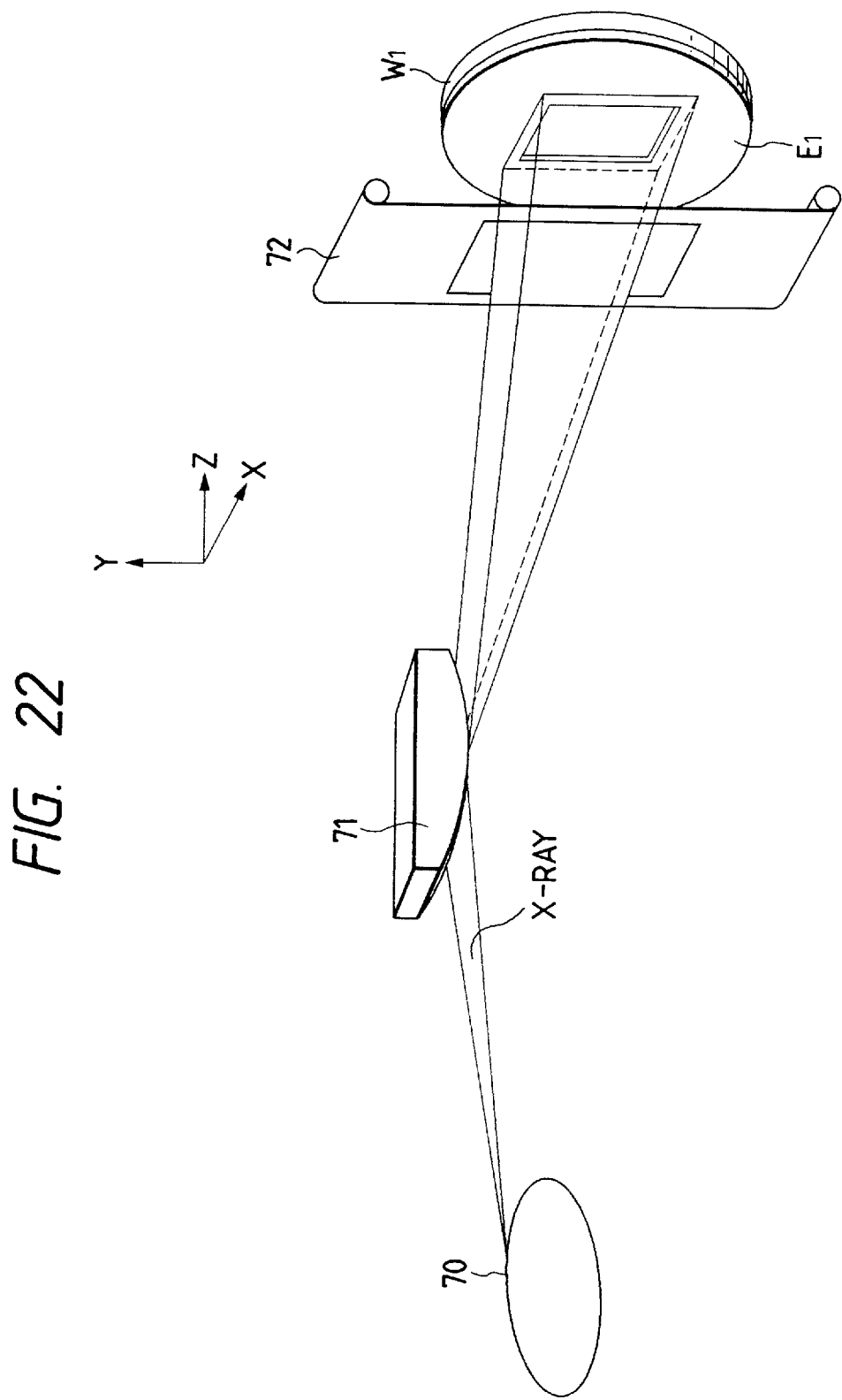
FIG. 22 is a view showing the entire configuration of an X-ray exposure apparatus.

FIG. 22 is a view showing the entire configuration of an X-ray exposure apparatus utilizing the mask supporting device according to any of the foregoing embodiments, wherein an X-ray of high intensity, emitted from a synchrotron ring 70 is expanded and directed, by an X-ray mirror 71, to the X-ray exposure apparatus. The exposure amount at the pattern transfer is controlled by a movable shutter 72. The X-ray passing through the shutter 72 is further transmitted by an X-ray mask E1 and patterns a photoresist on a wafer W1. The X-ray mask E1 is supported by a mask supporting device according to any of the foregoing embodiments, and the pattern transfer onto the wafer is executed after the adjustments of magnification and distortion in the mask pattern.

Figure 23:
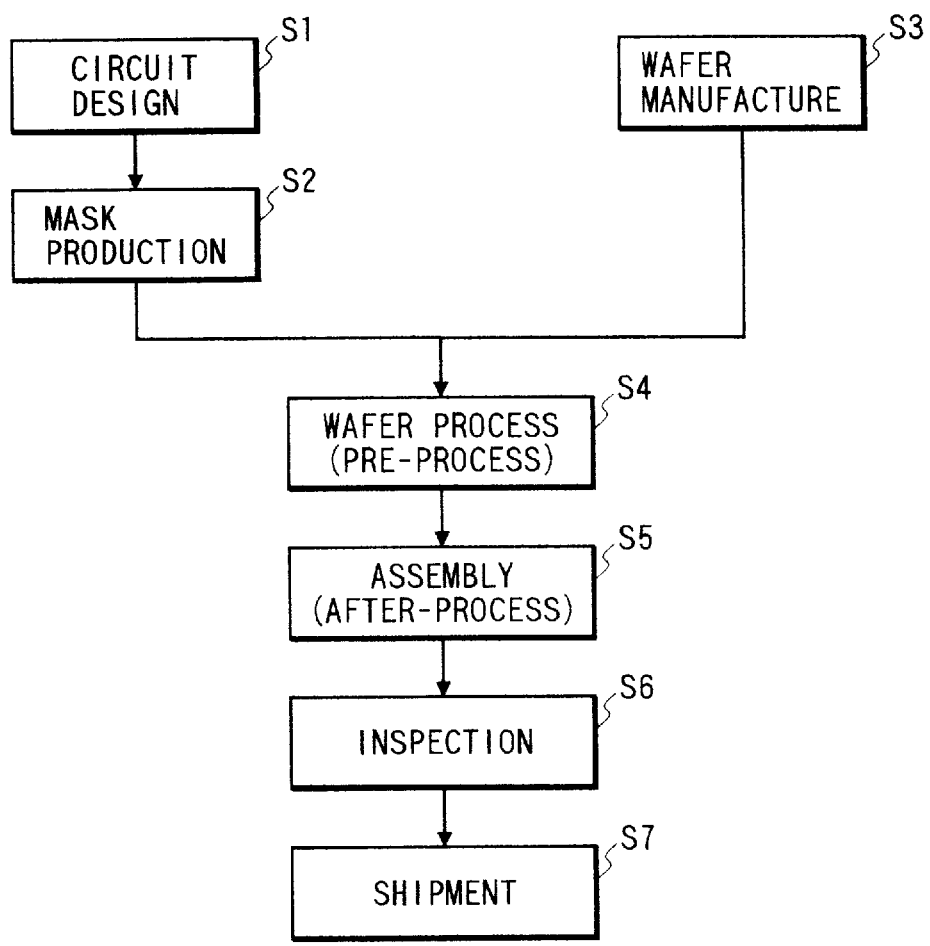
FIG. 23 is a flow chart showing the production process of a semiconductor device.

FIG. 23 is a flow chart showing the production process of a semiconductor device (such as an IC, an LSI, a liquid crystal panel or a CCD), utilizing the exposure apparatus explained above. A step 1 (circuit design) executes circuit designing of such semiconductor device, and a step 2 (mask production) prepares a mask bearing the designed circuit pattern. A step 3 (wafer manufacture) prepares a wafer for example with silicon. A step 4 (wafer process), called a pre-process or a front end process, forms the actual circuit on the wafer by a lithographic technology, utilizing the prepared mask and wafer. A step 5 (assembly), called post-process, prepares a semiconductor chip from the wafer processed in the step 4, and includes assembly steps (dicing and bonding) and a packaging step (chip sealing). A step 6 (inspection) executes inspections such as an operation test and a durability test of the semiconductor device prepared in the step 5. The semiconductor device is completed through these steps and is shipped out (step 7).

Figure 24:
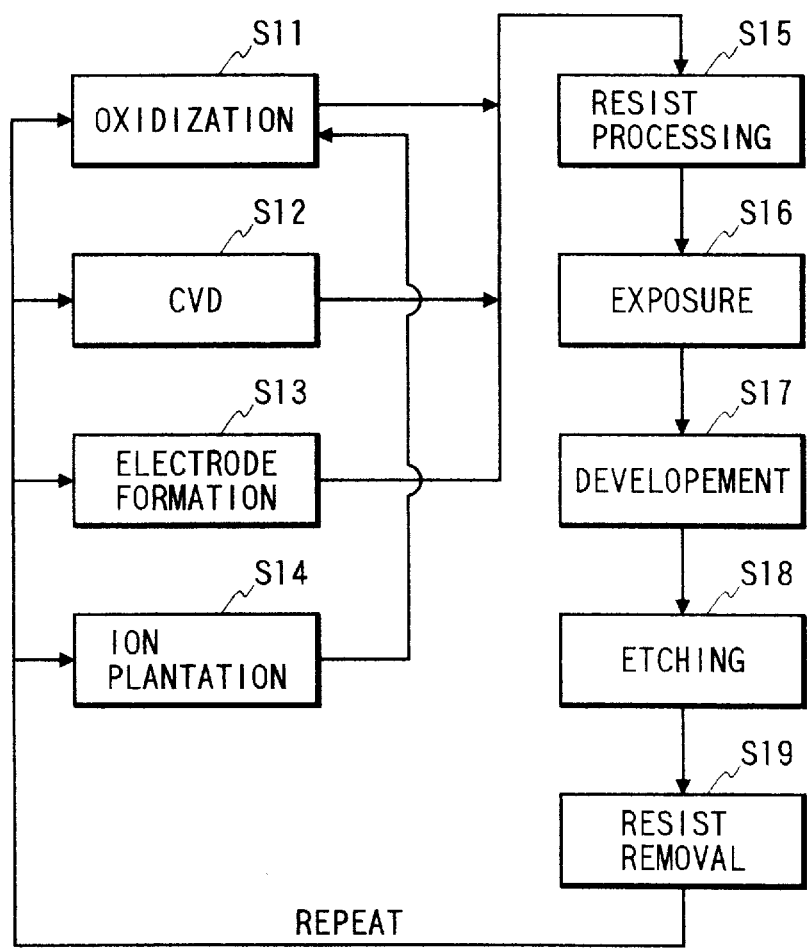
FIG. 24 is a detailed flow chart of a wafer process.

FIG. 24 shows the details of the wafer process mentioned above. A step S11 (oxidation) oxidizes the surface of the wafer. A step S12 (CVD) forms an insulation film on the surface of the wafer. A step S13 (electrode formation) forms electrodes on the wafer by evaporation. A step S14 (ion implantation) implants ions into the wafer. A step S15 (resist process) coats a photosensitive material on the wafer. A step S16 (exposure) prints the circuit pattern of the mask onto the wafer by the exposure operation explained in the foregoing. A step S17 (development) develops the exposed wafer, and a step S18 (etching) removes the portions other than the developed resist image. A step S19 (resist removal) strips the resist which has become unnecessary after the etching. Multi-layered circuit patterns are formed on the wafer by the repetition of these steps.

While the invention has been described with reference to the embodiments disclosed herein, it is to be understood that the invention is not limited to the disclosed embodiments but is intended to cover various modifications and changes included within the spirit and scope of the following claims.

What is claimed is:

1. A mask supporting device comprising:
    a chuck mechanism for supporting an X-ray mask having a mask substrate provided with a rectangular window on which a mask pattern is formed and a frame for reinforcing said mask substrate; and
    a mechanism for applying loads to said frame of the mask from mutually orthogonal directions in a plane parallel with a surface of the mask pattern for deforming and correcting the mask pattern.

2. A mask supporting device according to claim 1, wherein said frame has a rectangular external periphery.

3. A mask supporting device according to claim 1, wherein said frame has a circular external periphery.

4. A mask supporting device according to claim 1, further comprising a detection mechanism for detecting the applied loads.

5. A mask supporting device according to claim 4, further comprising means for adjusting the applied loads on the detection of said detection mechanism.

6. A mask supporting device according to claim 1, wherein said chuck mechanism includes a mechanical damper for clamping said frame in plural positions.

7. A mask supporting device according to claim 1, wherein said chuck mechanism includes a vacuum, magnetic or electrostatic suction mechanism.

8. A mask supporting device according to claim 1, wherein said mechanism for applying loads includes a fixed reference contacting two positions on the external periphery of the mask frame and two pressing mechanisms for applying loads to the mask frame from two directions respectively opposed to said two contact positions.

9. A mask supporting device according to claim 1, wherein said mechanism for applying loads includes four pressing mechanisms for applying loads to the mask frame, toward the center of the mask, from the directions of extensions of mutually orthogonal two lines passing through the center of the mask.

10. A mask supporting device according to claim 1, wherein said mechanism for applying loads is capable of both pushing and pulling the external periphery of the frame.

11. A mask correcting method comprising the steps of:
    preparing an X-ray mask including a mask substrate provided with a rectangular window in which a mask pattern is formed, and a ring-shaped frame for reinforcing said mask substrate; and
    correcting the mask pattern by applying loads to the external periphery of said frame from mutually orthogonal directions in a plane parallel with a surface of the mask pattern, for deforming and correcting the mask pattern.

12. A device producing method comprising the steps of:
    correcting a mask by i) preparing an X-ray mask including a mask substrate provided with a rectangular window in which a mask pattern is formed, and a ring-shaped frame for reinforcing said mask substrate, and ii) correcting the mask pattern by applying loads to the external periphery of said frame from mutually orthogonal directions in a plane parallel with a surface of the mask pattern, for deforming and correcting the mask pattern; and
    transferring the mask onto a wafer, by irradiating a mask corrected by the mask correcting step with an exposure energy.

13. An X-ray mask comprising:
    a mask substrate provided with a rectangular window in which a mask pattern is formed;

a frame for reinforcing said mask substrate; and a plurality of strain gauges provided on said mask substrate for detecting loads respectively applied to said frame of the mask from mutually orthogonal directions in a plane parallel with a surface of the mask pattern.

14. An exposure apparatus comprising:

a mask supporting device comprising, i) a chuck mechanism for supporting an X-ray mask having a mask substrate provided with a rectangular window on which a mask pattern is formed and a frame for reinforcing said mask substrate, and ii) a mechanism for applying loads to said frame of the mask from mutually orthogonal directions in a plane parallel with the surface of the mask pattern for deforming and correcting the mask pattern; and means for irradiating the supported mask with an exposure energy.

* * * * *

UNITED STATES PATENT AND TRADEMARK OFFICE
CERTIFICATE OF CORRECTION

PATENT NO. : 5,854,819

DATED : December 29, 1998

INVENTORS : SHINICHI HARA, ET AL.

It is certified that error appears in the above-identified patent and that said Letters Patent is hereby corrected as shown below:

ON THE COVER PAGE

At item [57], in the "ABSTRACT", line 9, "mechanism" should read --mechanisms--.

COLUMN 4:

line 64, "X," should read --X--.

COLUMN 5:

line 30, "about" should read --about the-- and "is avoid" should read --avoids--; and
    line 66, "an" should be deleted.

COLUMN 11:

line 27, "of-a" should read --of a--.

COLUMN 12:

line 23, "externals" should read --external--.

UNITED STATES PATENT AND TRADEMARK OFFICE
CERTIFICATE OF CORRECTION

PATENT NO. : 5,854,819

DATED : December 29, 1998

INVENTORS : SHINICHI HARA, ET AL.

It is certified that error appears in the above-identified patent and that said Letters Patent is hereby corrected as shown below:

COLUMN 14:

line 21, "will" should read --will be--.

COLUMN 16:

line 22, "damper" should read --clamper--.

Signed and Sealed this

Twenty-first Day of September, 1999

Attest:

Attesting Officer

Q. TODD DICKINSON

Acting Commissioner of Patents and Trademarks